US012795848B2

(12) United States Patent
Bhandari et al.

(10) Patent No.: US 12,795,848 B2
(45) Date of Patent: Nov. 10, 2026

(54) CONNECTOR ASSEMBLY WITH PULLBACK

(71) Applicant: Tesla, Inc., Austin, TX (US)

(72) Inventors: Rishabh Bhandari, San Carlos, CA (US); Xiaoping Qin, San Jose, CA (US); Xuyang Zhang, San Jose, CA (US); Frank Spiteri, Palo Alto, CA (US); David Luna, Palo Alto, CA (US)

(73) Assignee: Tesla, Inc., Austin, TX (US)

( * ) Notice: Subject to any disclaimer, the term of this patent is extended or adjusted under 35 U.S.C. 154(b) by 88 days.

(21) Appl. No.: 18/900,399

(22) Filed: Sep. 27, 2024

(65) Prior Publication Data

US 2025/0120034 A1 Apr. 10, 2025

Related U.S. Application Data

(60) Provisional application No. 63/588,250, filed on Oct. 5, 2023, provisional application No. 63/588,257, filed on Oct. 5, 2023.

(51) Int. Cl.
*H05K 7/14* (2006.01)

(52) U.S. Cl.
CPC .................................. *H05K 7/1454* (2013.01)

(58) Field of Classification Search
None
See application file for complete search history.

(56) References Cited

U.S. PATENT DOCUMENTS 4,035,897 A 7/1977 Over
4,552,260 A 11/1985 Teagno
4,778,400 A 10/1988 Jacobs
5,118,310 A 6/1992 Stroede
5,252,087 A 10/1993 Spinnato
6,551,123 B1 4/2003 Schaeffeler
7,789,668 B1 9/2010 Hamner et al.
8,202,012 B2 6/2012 Stewart
9,257,778 B2 2/2016 Buck
9,781,858 B2 10/2017 Fricker et al.
10,038,262 B1 7/2018 Behziz
10,084,255 B2 * 9/2018 Wang ................... H05K 5/0065
10,958,014 B1 * 3/2021 Martin ............... H01R 13/6215
10,994,892 B2 5/2021 Bell
2004/0022045 A1 2/2004 Ishida
2005/0105280 A1 * 5/2005 Doll ........................ G06F 1/183
439/246

(Continued)

FOREIGN PATENT DOCUMENTS

EP 2 959 635 8/2017
JP 09-102335 4/1997

(Continued)

*Primary Examiner* — Kenneth Bukowski

(74) *Attorney, Agent, or Firm* — Knobbe, Martens, Olson & Bear, LLP

(57) ABSTRACT

Aspects of this disclosure relate to a computing system. The computing system may include a computing tile positioned in a computing cabinet. The computing system may include a connector assembly connecting a computing tile with another computing tile housed in a second computing cabinet. The connector assembly may include a connector and an adjustment plate to adjust the connector in a dimension. The adjustment plate can move along a dimension away from a computing tile.

20 Claims, 29 Drawing Sheets

(56) References Cited

U.S. PATENT DOCUMENTS

| | | | |
|---|---|---|---|
| 2008/0026625 A1 | 1/2008 | Carver et al. | |
| 2010/0027941 A1 | 2/2010 | Stewart | |
| 2011/0002108 A1* | 1/2011 | Dahlfort | H04Q 1/15<br>361/796 |
| 2011/0250773 A1 | 10/2011 | Hamner et al. | |
| 2013/0273781 A1 | 10/2013 | Buck | |
| 2014/0001937 A1 | 1/2014 | Cerniglia et al. | |
| 2014/0239718 A1* | 8/2014 | Giles | G06F 1/181<br>307/26 |
| 2014/0241203 A1* | 8/2014 | Elson | H04L 41/12<br>370/254 |
| 2015/0289405 A1* | 10/2015 | Stewart | G06F 13/409<br>211/26 |
| 2015/0334868 A1 | 11/2015 | Fricker et al. | |
| 2018/0277991 A1* | 9/2018 | Endo | H01R 13/6315 |
| 2018/0376608 A1 | 12/2018 | Nordin et al. | |
| 2020/0323097 A1* | 10/2020 | Demange | H05K 7/1492 |
| 2021/0198052 A1 | 7/2021 | Nagelmuller et al. | |
| 2022/0122637 A1* | 4/2022 | Mendonsa | H05K 5/0247 |
| 2024/0356285 A1 | 10/2024 | Li et al. | |

FOREIGN PATENT DOCUMENTS

| | | |
|---|---|---|
| WO | WO 2012/148393 | 11/2012 |
| WO | WO 2017/126186 | 7/2017 |
| WO | WO 2023/023025 | 2/2023 |
| WO | WO 2024/072903 | 4/2024 |

* cited by examiner

CONNECTOR ASSEMBLY WITH PULLBACK

CROSS-REFERENCE TO RELATED APPLICATIONS

This application claims the benefit of U.S. Provisional Patent Application No. 63/588,250, titled "BLIND CONNECTOR SYSTEM FOR COMPUTING CABINETS," filed Oct. 5, 2023 and U.S. Provisional Patent Application No. 63/588,257, titled "BLIND CONNECTOR ASSEMBLY WITH Y-PULLBACK," filed Oct. 5, 2023, the disclosures of which are incorporated herein by reference in their entireties and for all purposes.

TECHNICAL FIELD

The present disclosure relates generally to computing systems. More specifically, embodiments of this disclosure relate to connector systems for making connections between computing cabinets of a computing system.

BACKGROUND

Certain computing systems can be used in and/or specifically configured for high performance computing and/or computationally intensive applications. Computing systems can include computing cabinets that each include computing resources. Computing resources in neighboring cabinets can be connected to each other.

SUMMARY OF CERTAIN INVENTIVE ASPECTS

The innovations described in the claims each have several aspects, no single one of which is solely responsible for its desirable attributes. Without limiting the scope of the claims, some prominent features of this disclosure will now be briefly described.

One aspect of this disclosure is a computing system. The computing system includes a first computing tile housed in a first computing cabinet. The computing system includes a second computing tile housed in a second computing cabinet. The computing system includes a connector configured to connect the first computing tile and the second computing tile. The computing system includes a first holder tube positioned within first computing cabinet, the first holder tube configured to provide access to the connector and dimensioned to receive an assembly tool to adjust the connector in at least one dimension. The computing system includes a second holder tube positioned within the second computing cabinet, the second holder tube configured to provide access to the connector and dimensioned to receive the assembly tool to adjust the connector in at least one dimension.

The first computing tile can include a cooling solution and a system on a wafer integrated with the cooling solution.

A connector assembly can include the connector, an X-adjustment plate configured to adjust the connector in a first dimension, a Y-adjustment plate configured to adjust the connector in a second dimension, a Z-adjustment plate configured to adjust the connector in a third dimension, and one or more flexible cables.

The X-adjustment plate, the Y-adjustment plate, and the Z-adjustment plate can be adjustable by the assembly tool when the assembly tool is positioned in the first holder tube and aligned with the connector.

The first holder tube can include alignment holes configured to mate with alignment features of the assembly tool.

The alignment features can engage with the alignment holes. The alignment features can provide feedback when engaging with the alignment holes.

A connector assembly can include the connector and one or more magnets configured to provide rough alignment between the connector and the first computing tile.

Another aspect of this disclosure is a method. The method includes inserting an assembly tool into a holder tube of a first computing cabinet. The first computing cabinet includes a first computing tile and is adjacent to a second computing cabinet. The method includes connecting a connector to the first computing tile using the assembly tool inserted in the holder tube such that the first computing tile is connected to a second computing tile of the second computing cabinet by the connector.

The method can further include connecting the connector to the second computing tile of the second computing cabinet prior to inserting the assembly tool into the holder tube of the first computing cabinet.

The method can further include disconnecting the connector from the first computing tile using the assembly tool inserted in the holder tube.

The method can further include adjusting the connector in a dimension using an adjustment plate.

The adjusting can be performed using the assembly tool when the assembly tool is positioned in the holder tube and aligned with the connector.

The inserting the assembly tool can cause alignment holes of the holder tube to mate with alignment features of the assembly tool.

The alignment features can provide feedback when engaging with the alignment holes.

The method can further include roughly aligning the connector and the first computing tile using one or more magnets.

Another aspect of this disclosure is a computing cabinet. The computing cabinet includes connectors configured to connect a first computing tile positioned within the computing cabinet to a second computing tile positioned within a second computing cabinet. The computing cabinet includes a holder tube within the computing cabinet and dimensioned to receive an assembly tool. The holder tube is configured to provide the assembly tool with access to the connectors to connect one or more the connectors to the first computing tile.

A connector system can include the connectors, an X-adjustment plate configured to adjust the connectors in a first dimension, a Y-adjustment plate configured to adjust the connectors in a second dimension, a Z-adjustment plate configured to adjust the connectors in a third dimensions, and one or more flexible cables.

The first computing tile can include a cooling solution and a system on a wafer integrated with the cooling solution.

The holder tube can include alignment holes configured to mate with alignment features of the assembly tool.

A connector assembly can include the connectors and one or more magnets configured to provide rough alignment between the connectors and the first computing tile.

Another aspect of this disclosure is a method. The method includes inserting a system tray into a computing cabinet with a connector in a first position. The system tray includes a plurality of computing tiles. The method includes moving the connector in a first dimension from the first position to a second position where the connector is aligned with a computing tile connector of a computing tile of the plurality of computing tiles in the first dimension. The method includes moving the connector in a second dimension that is orthogonal to the first dimension to connect the connector with the computing tile connector.

The method can include disconnecting the connector from the computing tile connector, moving the connector in the first dimension away from the computing tile, and removing the system tray from the computing cabinet.

The connector can be connected to a second computing tile connector located in a second computing cabinet during the removing.

Moving the connector in the first dimension from the first position to the second position can include using an alignment tool to move a Y-adjustment plate of a connector system along the first dimension, wherein the connector system includes the connector.

The first position of the connector can be out of alignment with the computing tile and provides clearance for the inserting.

The computing cabinet can positioned adjacent to a second computing cabinet. The connector can provide a connection between the computing tile and a second computing tile in the second computing cabinet.

After the inserting there may be no direct access to the connector.

There may be no direct access to the connector during the inserting.

The connector may be connected to a second computing tile connector located in a second computing cabinet during the moving the connector in the first dimension.

The method can include, after the system tray is inserted into the computing cabinet, inserting an assembly tool into a holder tube of the computing cabinet and moving, using the assembly tool, the connector in alignment with the computing tile connector in a third dimension.

Another aspect of this disclosure is a computing system. The computing system includes a computing tile positioned in a computing cabinet. The computing system includes a connector assembly configured to connect the computing tile with another computing tile housed in a second computing cabinet. The connector assembly includes a connector and an adjustment plate configured to adjust the connector in a dimension. The adjustment plate is configured to move along a dimension away from the computing tile.

The adjustment plate can include an adjustment pin movable along a cam.

The computing cabinet can include a holder tube configured to provide an adjustment tool with access to the adjustment pin.

As the adjustment plate moves back and forth along the dimension, the connector can move in and out of alignment with the computing tile.

The connector being out of alignment with the computing tile can provide more clearance for removal of the computing tile.

The computing tile can be positioned on a system tray, the computing system configured such that there is no direct access to the connector when the system tray is positioned in the computing cabinet.

The computing system can include a plurality of system trays position in the computing cabinet. Each system tray of the plurality of system trays can include a plurality of computing tiles.

The computing system can include a plurality of computing tiles in the second computing cabinet. The plurality of computing tiles can include the other computing tile.

The computing system can include a holder tube within the computing cabinet and dimensioned to receive an assembly tool. The holder tube can be configured to provide the assembly tool with access to the connector to connect the connector to the computing tile.

Another aspect of this disclosure is a method. The method includes disconnecting a connector from a computing tile on a system tray while the system tray is positioned in a computing cabinet. The method includes, after the disconnecting, moving the connector in a first dimension away from the computing tile to a pullback position. The method includes removing the system tray from the computing cabinet while the connector is in the pullback position.

Moving the connector in the first dimension away from the computing tile to a pullback position can include using an alignment tool to move an adjustment plate of a connector system along the first dimension. The connector system can include the connector.

The pullback position of the connector can be out of alignment with the computing tile and provide clearance for the removing.

The connector can be connected to a second computing tile located in a second computing cabinet during the removing.

For purposes of summarizing the disclosure, certain aspects, advantages and novel features of the innovations have been described herein. It is to be understood that not necessarily all such advantages may be achieved in accordance with any particular embodiment. Thus, the innovations may be embodied or carried out in a manner that achieves or optimizes one advantage or group of advantages as taught herein without necessarily achieving other advantages as may be taught or suggested herein.

BRIEF DESCRIPTION OF THE DRAWINGS

Specific implementations will now be described with reference to the following drawings, which are provided by way of example, and not limitation.

FIGS. 7A-7F illustrate aspects of a blind connector assembly according to various embodiments.

FIGS. 13A-13C illustrate steps of an assembly process for assembling a blind connector according to an embodiment.

DETAILED DESCRIPTION

Figure 1A:
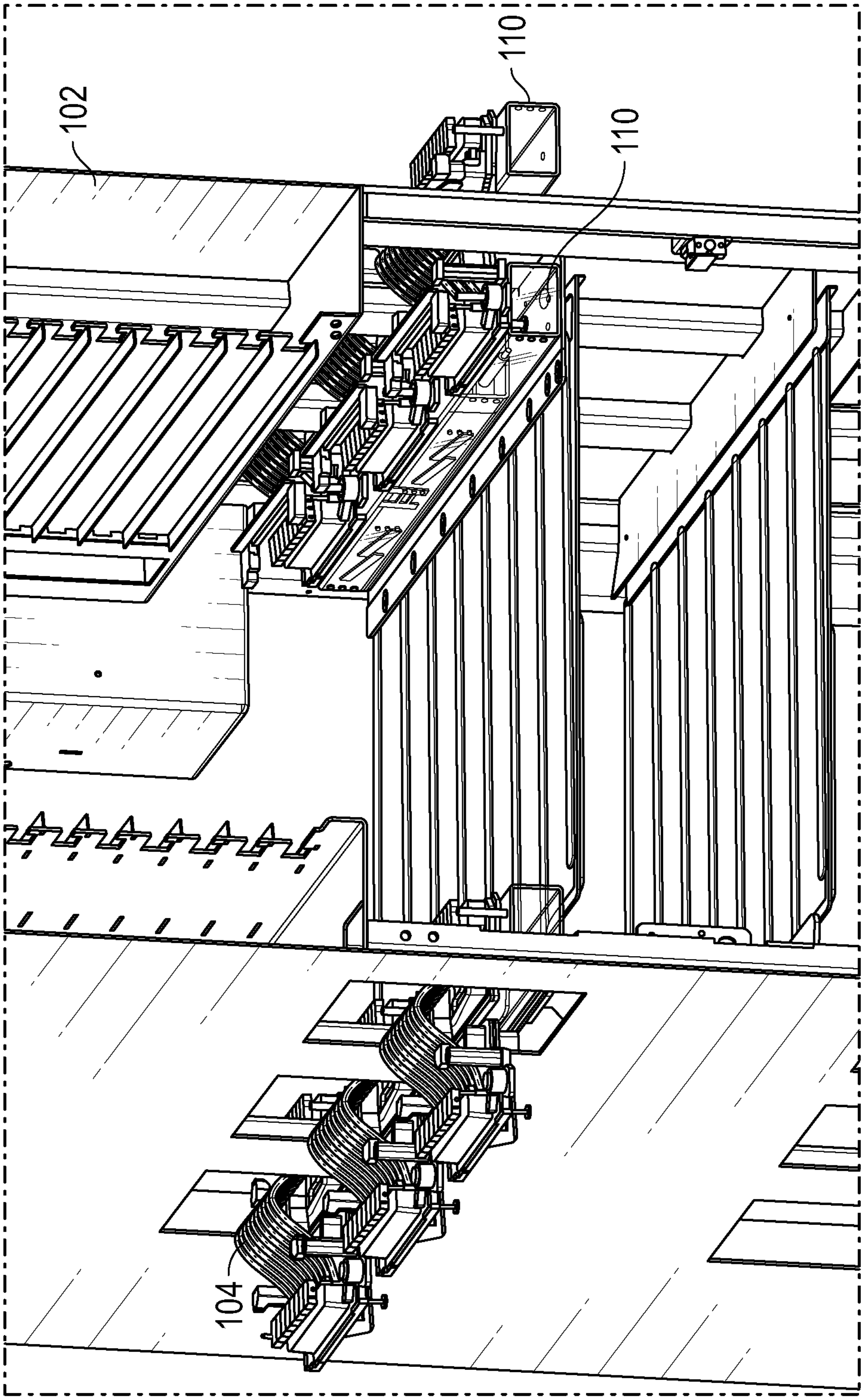
FIG. 1A is a perspective view of a portion of a computing cabinet according to an embodiment.

The following description of certain embodiments presents various descriptions of specific embodiments. However, the innovations described herein can be embodied in a multitude of different ways, for example, as defined and covered by the claims. In this description, reference is made to the drawings where like reference numerals can indicate identical or functionally similar elements. It will be understood that elements illustrated in the figures are not necessarily drawn to scale. Moreover, it will be understood that certain embodiments can include more elements than illustrated in a drawing and/or a subset of the elements illustrated in a drawing. Further, some embodiments can incorporate any suitable combination of features from two or more drawings. Any suitable principles and advantages of the embodiments disclosed herein can be implemented together with each other. The headings provided herein are for convenience only and are not intended to affect the meaning or scope of the claims.

The present disclosure generally relates to computing systems. Certain computing systems can be used in and/or specifically configured for high performance computing and/or computationally intensive applications, such as neural network training, neural network inference, machine learning, artificial intelligence, complex simulations, or the like. In some applications, a computing system can be used to perform neural network training. For example, such neural network training can generate data for an autopilot system for vehicle (e.g., an automobile), other autonomous vehicle functionality, or Advanced Driving Assistance System (ADAS) functionality.

Certain computing systems can include various levels of hierarchy to perform computing tasks. For example, a computing system can include computing tiles that each include a plurality of chips packaged together, system trays that include an array of connected computing tiles, and cabinets that each include one or more system trays. Computing tiles can include integrated cooling solutions. Computing tiles can include a system on a wafer and a plurality of voltage regulating modules in certain applications. The system on a wafer can include an array of integrated circuit dies. In certain applications, there can be one voltage regulating module aligned with and configured to provide power to each integrated circuit die of the system on a wafer.

This disclosure relates to connecting computing tiles of adjacent cabinets of a computing system. The computing tiles and cabinets disclosed herein can be configured for high performance computing applications.

Aspects of this disclosure relate to a blind connector system for a computing cabinet. The blind connector system allows an external tool to make blind connections between computing tiles in adjacent cabinets. The blind connector system can include a holder tube, such as an extruded tube, dimensioned for insertion of an external tool. The external tool can connect connectors to a computing tile to connect computing tiles of adjacent computing cabinets when positioned within the holder tube.

Using an external tool to connect blind connectors to a computing tile can replace multiple actuators in certain other technical solutions. This can reduce the complexity of a computing cabinet by reducing the part count of the computing cabinet by not including actuators in the computing cabinet to align blind connectors with computing tile connectors. Connecting blind connectors with an external tool can also reduce the total space the blind connectors occupy in the computing cabinet and/or between adjacent computing cabinets. Improvements can be made to the external tool over time to improve the blind connect at a later stage, such as after computing cabinets have been installed.

With the external tool, one side of a blind connector can be connected to a computing tile in a first computing cabinet and then the other side of the blind connector can sequentially be connected to another computing tile in a second computing cabinet. Connecting opposing sides of a blind connection independently can be advantageous. For example, it can be less challenging to align one side of a blind connector with a corresponding connector of a computing tile at a time. As another example, connecting each side of a blind connector individually can involve less force than connecting both sides of the blind connector at the same time. The force can be reduced by roughly half by connecting each side of a blind connector sequentially relative to connecting both sides of the blind connector simultaneously. Further, connecting opposing sides of a blind connection independently can enable a computing cabinet to be serviced without disturbing the adjacent computing cabinet.

Aspects of this disclosure relate to a blind connector system for a computing cabinet. The blind connector system can pull back a blind connector in a Y-dimension (generally referred to herein as "Y-pull back") to provide space for a system tray to be inserted into and/or removed from a computing cabinet. With Y-pull back of the blind connector system, there can be increased clearance for inserting and/or removing the system tray. Y-pull back can be implemented together with connecting blind connectors with an external tool in certain embodiments.

Blind Connector System for Computing Cabinet

High performance in computing can be significantly constrained by signal integrity of high-speed signals. Close proximity of computing nodes can be significant to achieving desirable signal integrity for high-speed signals.

The computing systems disclosed herein can reduce or eliminate mechanical constraints on electrical connections between computing tiles of different cabinets. Cabinets can include openings through which electrical connectors connect computing tiles positioned within adjacent cabinets. This can enable computing title to computing tile electrical connections between cabinets over short distances.

FIG. 1A illustrates a cabinet 102 according to an embodiment. Blind connector assemblies 104 can extend through opening in the cabinet 102. One end of the blind connector assemblies 104 can connect to computing tiles in the cabinet 102 and another end of the blind connector assemblies 104 can connect to computing tiles in an adjacent cabinet. The blind connector assemblies 104 can include adjustment components, such as Y-adjustment plate 202, X-adjustment plate 204, and Z-adjustment plate 206 shown in FIG. 2A, for example.

The cabinet 102 can include holder tubes 110 on the inside of the cabinet 102 near the openings. The holder tubes 110 can be referred to as extruded tubes. The holder tubes 110 can provide access to one end of blind connector assemblies 104. The holder tubes 110 can be dimensioned to receive an assembly tool, such as assembly tool 400 described in FIG. 4, for example. The assembly tool can adjust the alignment of the blind connector assembly 104, connect the blind connector assembly 104 to a computing tile, and/or disconnect the blind connector assembly 104 from a computing tile.

Each side of the blind connector assemblies 104, such as a first side accessible via a first holder tube 110 in cabinet 102 and a second side accessible via a second holder tube 110 in a second cabinet (not shown in FIG. 1A), can have an alignment adjusted, be connected to a computing tile, and/or be disconnected to a computing tile by the assembly tool individually. The connection and/or disconnection of the first side to a computing tile and any adjustment of the first side can be performed while the second side is connected to a computing tile in the second cabinet. Cabinets, such as cabinet 102 and an adjacent cabinet (not shown in FIG. 1A), may be misaligned in one or more dimensions and adjusting the blind connector assemblies 104 can compensate for the misalignment.

Two holder tubes 110 of the cabinet 102 are shown in FIG. 1A. In FIG. 1A, each holder tube 110 can provide access to 3 connector assemblies 104 for connecting 3 computing tiles within the cabinet 102 to 3 computing tiles in the adjacent cabinet (not shown in FIG. 1A). Each computing tile can include a system-on-a-wafer and an integrated cooling system. Six computing tiles can be positioned on a structural bus bar, and each of the illustrated holder tubes 110 of the cabinet 102 can provide access to 3 of the computing tiles on the structural busbar. The computing cabinet 102 can also include additional holder tubes positioned vertically relative to the illustrated holder tubes 110 for providing access to computing tiles that are positioned vertically relative to the computing tiles for which the illustrated holder tubes 110 provide access. Any suitable number of holder tubes 110 and computing tiles can be included in the cabinet 102 for a particular application.

Figure 1B:
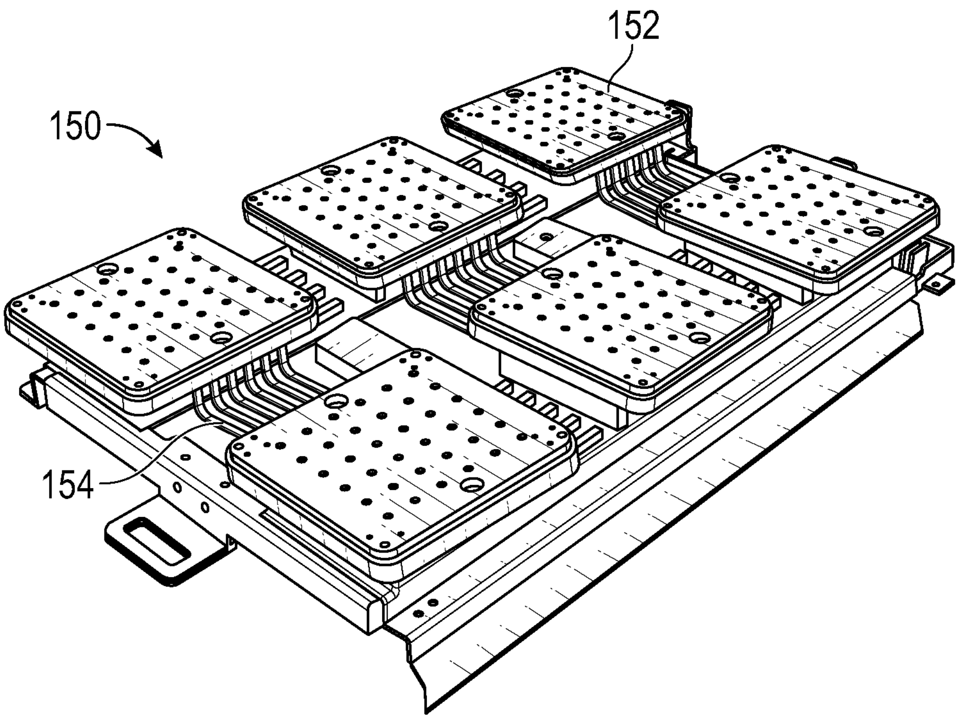
FIG. 1B illustrates a system tray according to an embodiment.

FIG. 1B illustrates an example system tray 150 according to an embodiment. The system tray 150 can include an array of computing tiles 152 connected together and supported by the system tray 150. In certain embodiments, each computing tile 152 includes a system on a wafer that includes an array of dies integrated with a cooling solution (e.g., a cold plate). For example, the system on a wafer can include 16, 25, 36, or 49 dies arranged to perform compute functions in various applications. In certain applications, the computing tile 152 can include an array of voltage regulating modules where each of the voltage regulating modules can provide a power supply voltage to a respective integrated circuit die of the system on a wafer. According to certain applications, the system on a wafer can be positioned between a cold plate and another cooling component to dissipate heat, remove heat, or otherwise reduce the temperature of components of a computing tile 152 during operation. The computing tiles 152 can be referred to as training tiles in neural network training applications. Each computing tile 152 of a system tray 150 can operate individually. As such, if a computing tile 152 of a system tray 150 fails and/or is removed from the system tray 150, the system tray 150 can continue to operate. Any suitable number of computing tiles 152 can be connected to each other on a system tray 150. For example, FIG. 1B illustrates six computing tiles 152 connected to each other. The system tray 150 can have a relatively high compute capacity.

The system tray 150 can include intra-tray signal delivery cables 154 to facilitate communication between computing tiles 152 of a system tray 150. The intra-tray signal delivery cables 154 can include one or more redundant connections. For example, the computing tiles 152 can be connected together through multiple intra-tray signal delivery cables 154. As such, if an intra-tray signal delivery cable 154 fails and/or is removed, and/or a computing tile 152 fails and/or is removed, the system tray 150 can continue to operate.

In the system tray 150, adjacent computing tiles 152 are connected to each other by intra-tray signal delivery cables 154. If a computing tile 152 fails, other computing tiles 152 on the system tray 150 can still function. For instance, an adjacent computing tile 152 can route signals around the failed computing tile 152 to functional computing tile(s) to perform computation tasks and/or to route signals around the failed computing tile 152. The computing tiles 152 can include connectors around their edges. The connectors of the computing tiles 152 can be connected to blind connector assemblies 104 to connect computing tiles 152 of two system tray 150 together with each other. The system tray 150 can include integrated cooling components to control the temperature of the computing tiles 152.

Figure 2A:
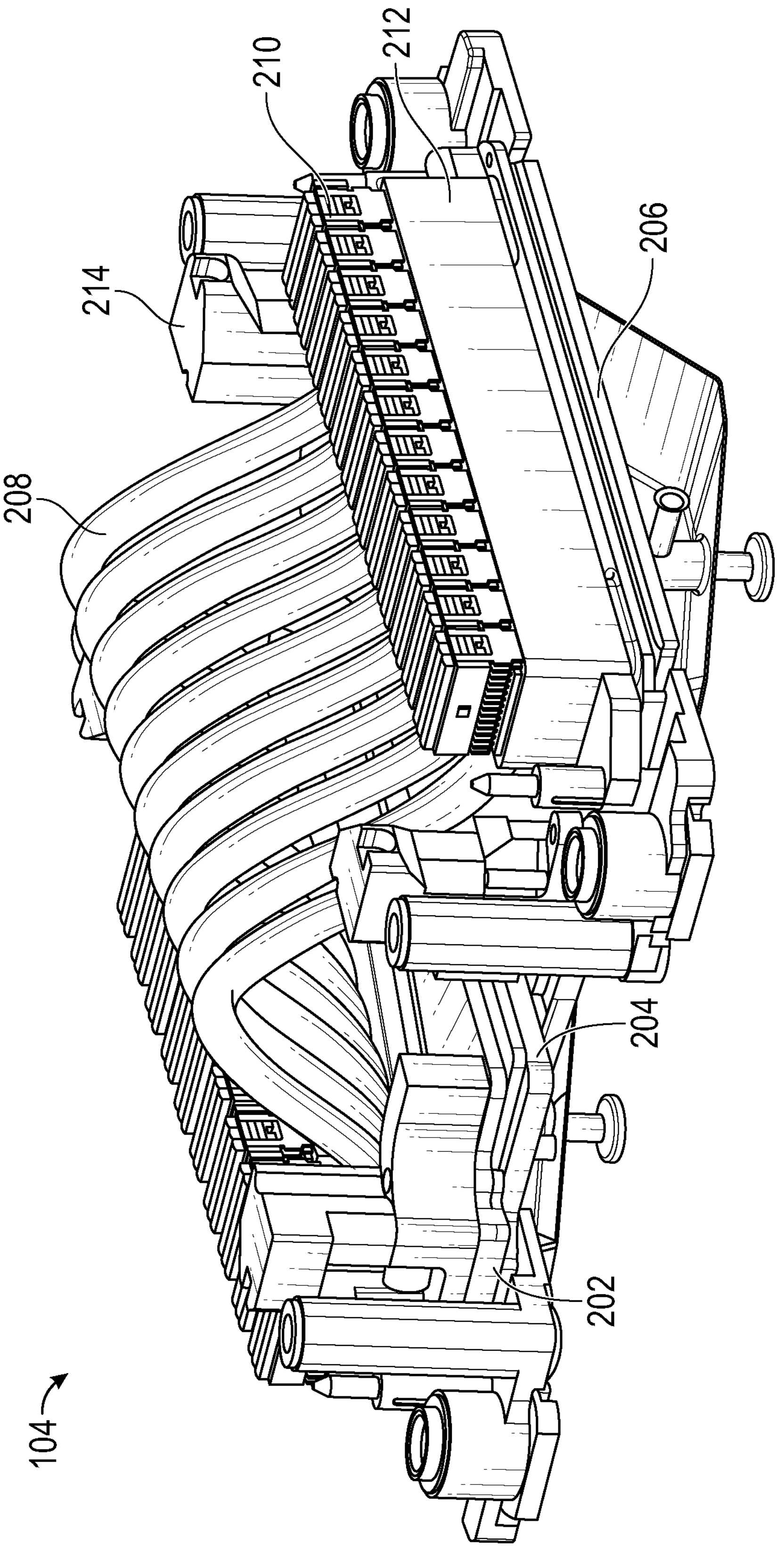
FIG. 2A is a perspective view of a blind connector assembly according to an embodiment.

FIG. 2A illustrates a blind connector assembly 104 according to an embodiment. Blind connector assembly 104 can include connector cables 208 that electrically connect the two halves of the blind connector assembly 104. Connector cables 208 can be insulated electrical conductors suitable to carry electrical signals between computing tiles. Connector cables 208 can be flexible, allowing a first half of the blind connector assembly 104 to move along one or more dimensions respective to the other half of the blind connector assembly 104.

The blind connector assembly 104 includes computing tile connectors 210. Each connector cable 208 can be coupled to computing tile connectors 210 on each end of the connector cable 208. The computing tile connectors 210 can correspond to a connector on the computing tiles, such that, when the computing tile connectors 210 of the blind connector assembly 104 are coupled to the corresponding connector, an electrical path is established from a first computing tile through a first tile connector 210, the connector cable 208, and a second computing tile connector 210 to a second computing tile. As illustrated, a blind connector assembly 104 can include multiple computing tile connectors 210 and connector cables 208.

Each half of the blind connector assembly 104 can include a Y-adjustment plate 202, an X-adjustment plate 204, a Z-adjustment plate 206, X-finders 214, and a connector housing 212. The connector housing 212 can physically couple the computing tile connectors 210 to the half of the blind connector assembly 104. The computing tile connectors 210 can be affixed to the Y-adjustment plate 202. The Y-adjustment plate 202 can adjust the half of the blind connector assembly 104 with respect to a first dimension. The Y-adjustment plate 202 can be connected to the X-adjustment plate 204. The X-adjustment plate 204 can adjust the half of the blind connector assembly 104 with respect to a second dimension, orthogonal to the first dimension. The X-adjustment plate 204 can be connected to the Z-adjustment plate 206. The Z-adjustment plate 206 can adjust the half of the blind connector assembly 104 with respect to a third dimension, orthogonal to the first dimension and the second dimension. As will be described below, the Z-adjustment plate 206 can interact with the assembly tool to adjust the half of the blind connector assembly 104 to couple the computing tile connectors 210 with the tiles and/or to decouple the computing tile connectors 210 from the computing tiles.

The blind connector assembly 104 includes X-finders 214. The X-finders 214 can help facilitate the alignment of the half of the blind connector assembly 104 in at least the second dimension. In some embodiments the X-finders 214 can also help facilitate the alignment of the half of the blind connector assembly 104 in one or more other dimensions, such as the first dimension. The X-finders 214 can include one or more magnets. Each system tray can include magnetic zones that interact with the X-finders 214 to create a rough alignment in one or more dimensions. The Y-adjustment plate 202, the X-adjustment plate 204, and the Z-adjustment plate 206 can then be used to provide precise alignment between the half of the blind connector assembly 104 and a computing tile on the system tray.

Figure 2B:
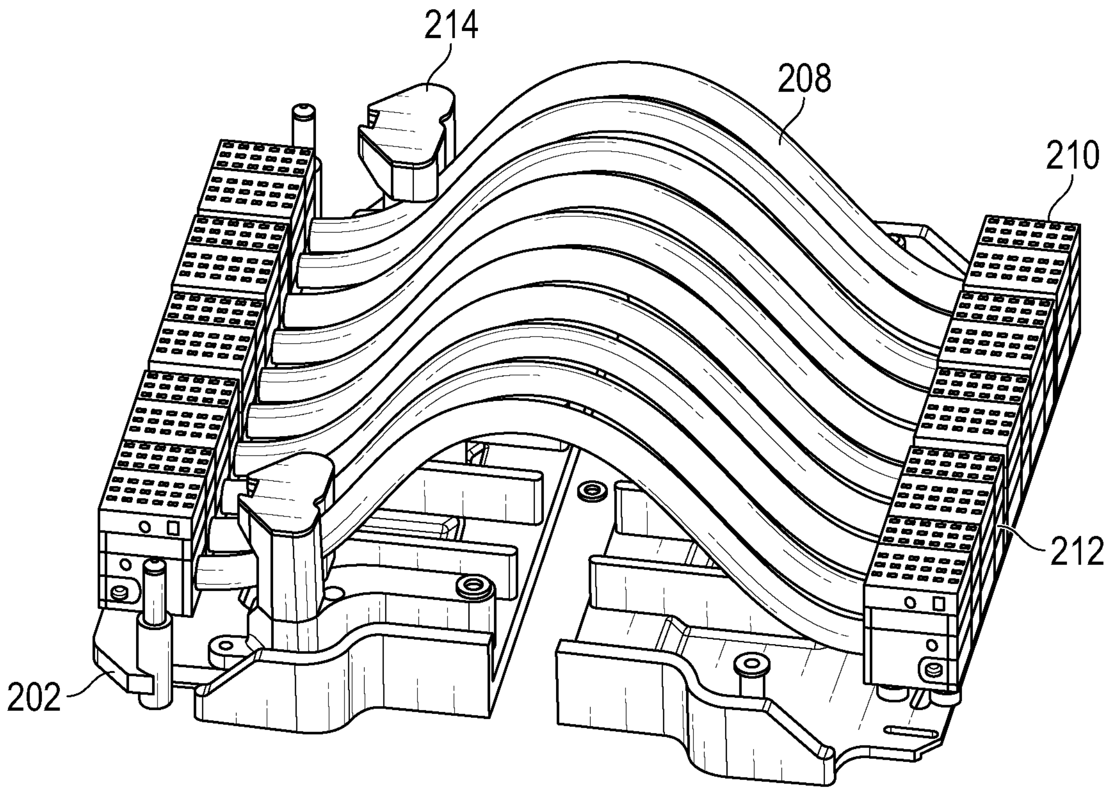
FIG. 2B is a perspective view of portion of a blind connector assembly.

FIG. 2B illustrates a perspective view of portion of a blind connector assembly 104 according to an embodiment. FIG. 2B illustrates ten connector cables 208 connecting ten sets of computing tile connectors 210. As illustrated, the computing tile connectors 210 are housed in a connector housing 212 that is connected to the Y-adjustment plate 202.

Figure 2C:
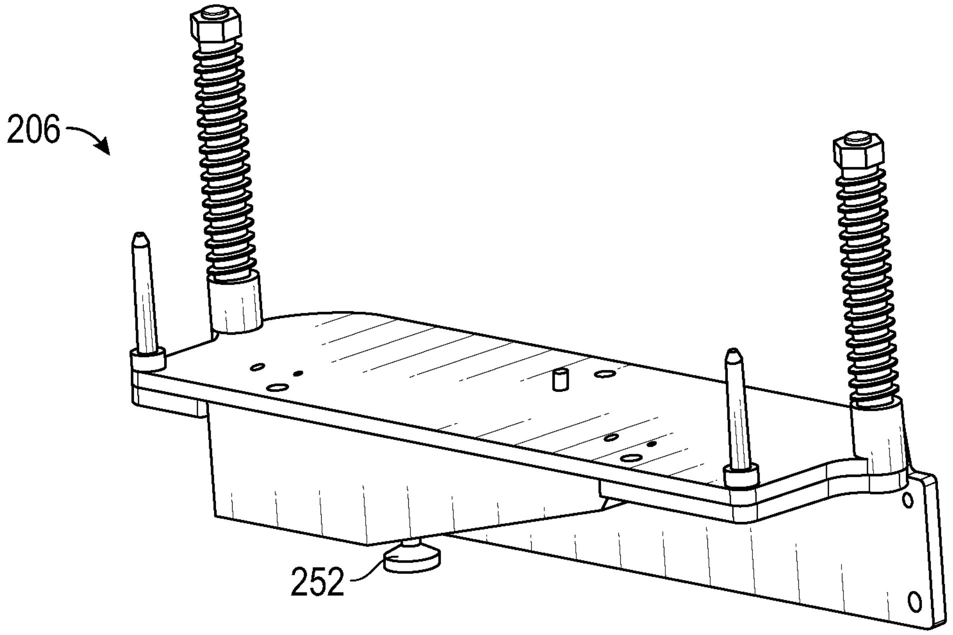
FIG. 2C is a perspective view of a Z-adjustment plate according to an embodiment.

FIG. 2C illustrates a perspective view of a Z-adjustment plate 206 according to an embodiment. As illustrated, Z-adjustment plate 206 can include adjustor 252. The adjustor 252 can interface with an assembly tool to facilitate an adjustment of the alignment of the blind connector assembly 104, a connection of the blind connector assembly 104 to a computing tile, and/or a of disconnection the blind connector assembly 104 from a computing tile.

Figure 3:
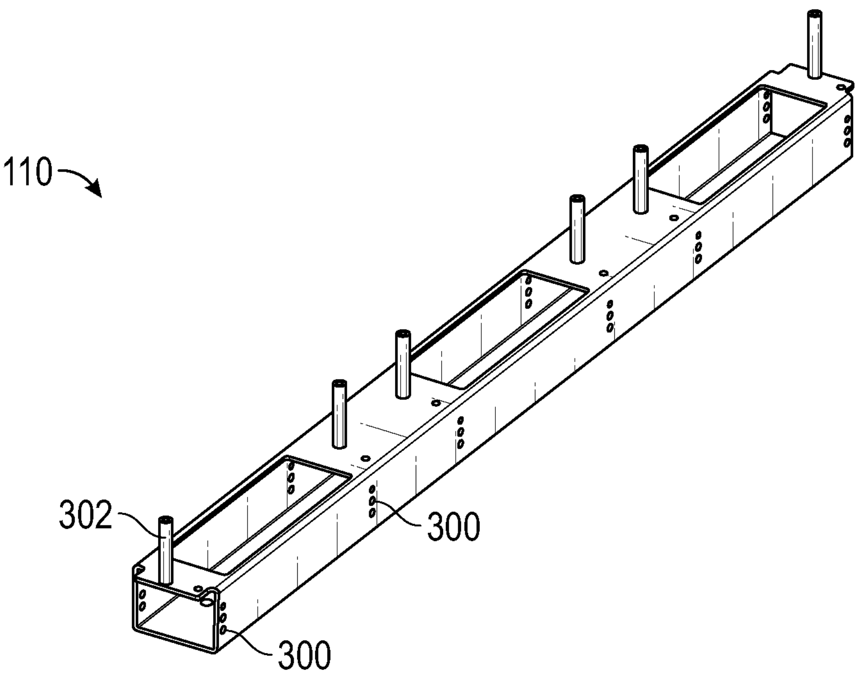
FIG. 3 is a perspective view of a holder tube according to an embodiment.

FIG. 3 illustrates a perspective view of a holder tube 110 according to an embodiment. As illustrated, the holder tube 110 can be divided into three sections, corresponding to three blind connector assemblies 104 that connect to respective computing tiles. The holder tube 110 can include any suitable number of such sections. Each section of the holder tube 110 can include a set of alignment pins 302. The alignment pins 302 can align an alignment structure of a blind connector assembly 104 to the holder tube 110. Each section of the holder tube 110 can include a set of alignment holes 300. As described in more detail in FIG. 4, the alignment holes 300 can facilitate the alignment of an assembly tool with a blind connector assembly 104.

Figure 4:
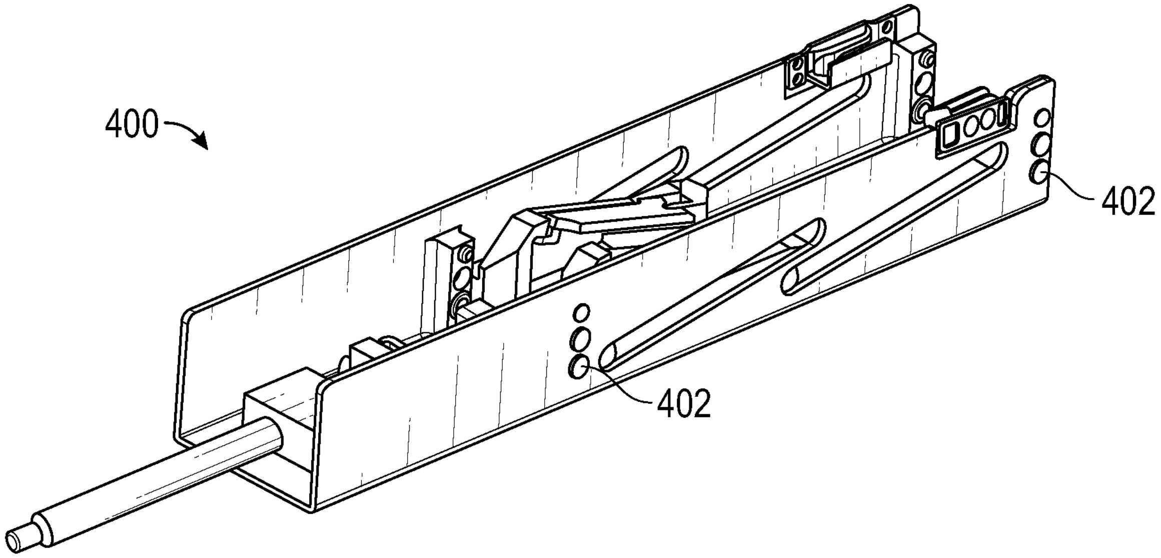
FIG. 4 is a perspective view of an assembly tool according to an embodiment.

FIG. 4 illustrates a perspective view of an assembly tool 400 according to an embodiment. As will be described in more detail in FIGS. 6A-6C, the assembly tool 400 and/or the disassembly tool 650 can adjust the alignment of blind connector assemblies 104, connect blind connector assemblies 104 to computing tiles, and/or disconnect blind connector assemblies 104 from computing tiles. The assembly tool 400 can be inserted into a holder tube 110 to interact with the blind connector assemblies 104.

The assembly tool 400 can include sets of alignment features 402 (e.g., alignment bumps) positioned on two sides of the assembly tool 400. The distance between sets of alignment features 402 on the assembly tool 400 can correspond to the distance between a set of alignment holes 300 on the holder tube 110. The sets of alignment features 402 may interact with the set of alignment holes 300 to hold the assembly tool 400 in alignment in the holder tube 110 with a blind connector assembly 104. When interacting with the set of alignment holes 300, the sets of alignment features 402 may provide feedback, such as haptic and audio feedback, indicating the assembly tool 400 is aligned with a blind connector assembly 104.

The sets of alignment features 402 may disengage from the set of alignment holes 300 in response to a force on the assembly tool 400. For example, a force pushing the assembly tool 400 further into the holder tube 110 can cause the sets of alignment features 402 to disengage from the sets of alignment holes 300. The feedback may allow a user of the assembly tool 400 to know which blind connector assembly 104 the assembly tool 400 is aligned with. For example, a user may insert the assembly tool 400 into the holder tube 110 until a first feedback indicates an alignment with a first blind connector assembly 104 or push the assembly tool 400 further into the holder tube 110 until feedback indicates an alignment with a second blind connector assembly 104, a third blind connector assembly 104, and so on.

Figure 5:
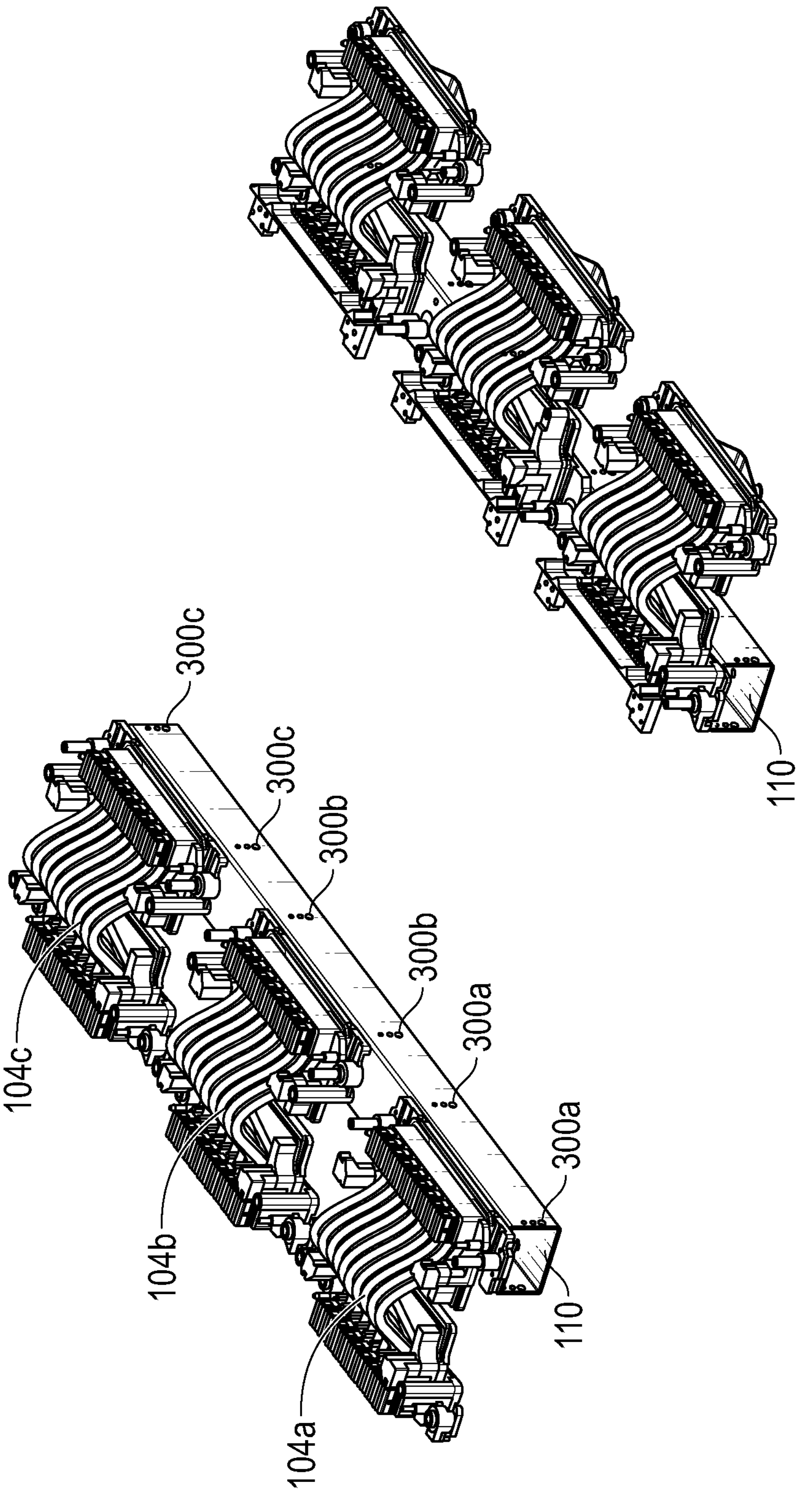
FIG. 5 illustrates sets of blind connector assemblies positioned on holder tubes.

FIG. 5 illustrates sets of blind connector assemblies 104 positioned on holder tubes 110. FIG. 5 illustrates three sets of set of alignment holes 300, alignment holes 300*a* corresponding to blind connector assembly 104*a*, alignment holes 300*b* corresponding to blind connector assembly 104*b*, and alignment holes 300*c* corresponding to blind connector assembly 104*c*. As such, to adjust blind connector assembly 104*a*, an adjustment tool 400 can be aligned to alignment holes 300*a*. Similarly, to adjust blind connector assembly 104*b*, an adjustment tool (e.g., the adjustment tool 400 of FIG. 4) can be aligned to alignment holes 300*c*, and so on.

Figure 6A:
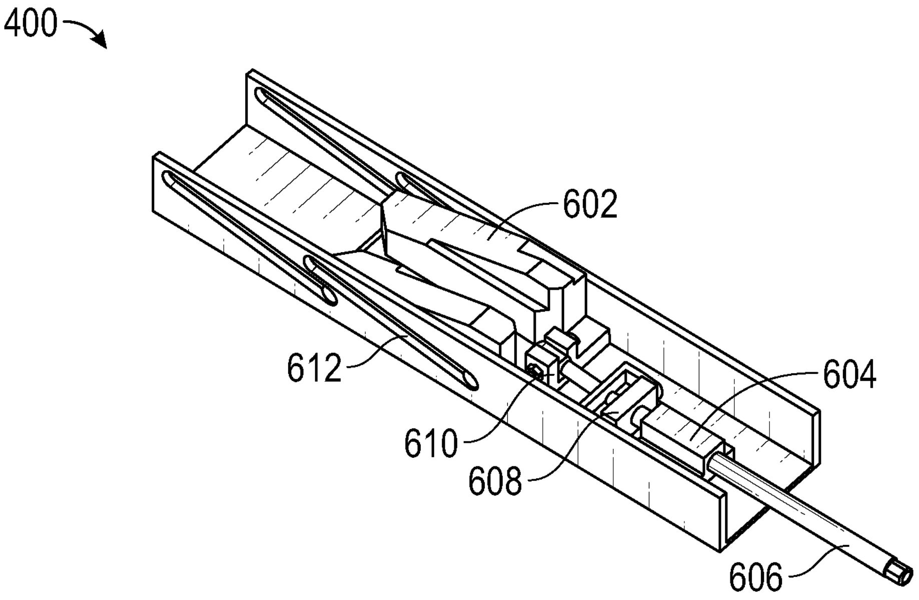
FIG. 6A illustrates an assembly tool according to an embodiment.

FIG. 6A illustrates an assembly tool 400 according to an embodiment. As illustrated, the assembly tool 400 can include an adjustment handle 606, a screw nut holder 604, a screw bearing 608, a push link bar 610, a push block 602, and push block tracks 612. The push block 602 can interact with the adjustor 252 on the Z-adjustment plate 206 of FIG. 2C to make adjustments to the blind connector assembly 104. For example, the push block 602 can interact with the adjustor 252 to move the blind connector assembly 104 in a connected position with a computing tile.

The push block 602 can move along block tracks 612. Block tracks 612 can be inclined with respect to a lower planer surface the assembly tool 400 such that, as the push block 602 moves along the block tracks 612, the push block 602 can raise within the assembly tool 400.

The adjustment handle 606 can include a round shaft. The adjustment handle 606 can rotate about the center of the round shaft to make adjustments with the assembly tool 400. The screw nut holder 604 can house the adjustment handle 606. The screw nut holder 604 can be fixed at the center of the assembly tool 400. The screw dry bearing 608 can move along with the adjustment handle 606 without rotating. The push link bar 610 can be connected to an end of the adjustment handle 606 and the push block 602. As the adjustment handle 606 makes adjustments, the adjustment handle 606 can cause the push block 602 to move along the block tracks 612.

Figure 6B:
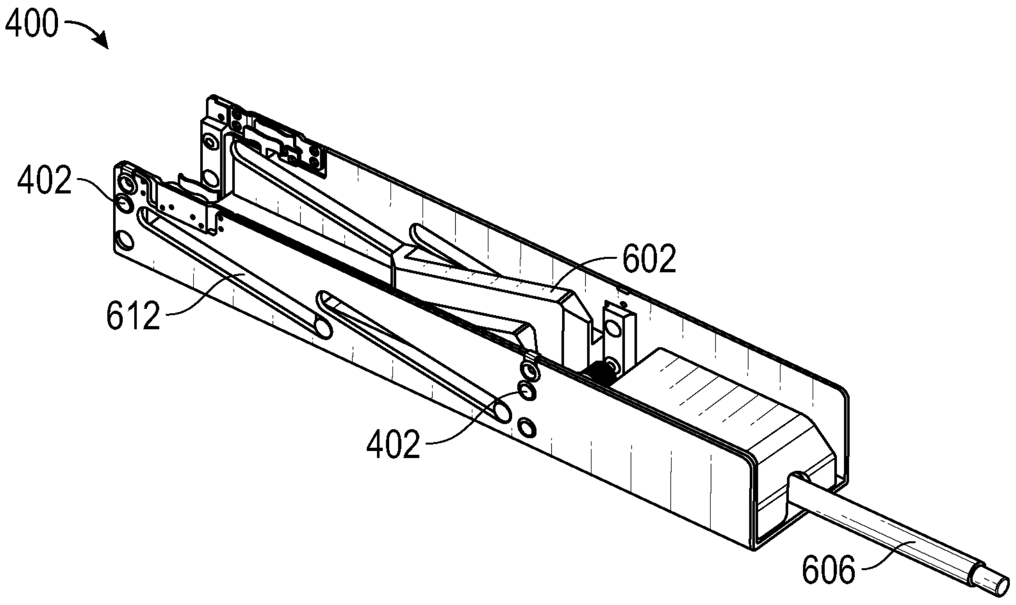
FIG. 6B illustrates an assembly tool according to another embodiment.

FIG. 6B illustrates an assembly tool 400 according to another embodiment. The embodiment illustrated in FIG. 6B can include any suitable features described above with respect to FIG. 6A. As illustrated in FIG. 6B, the assembly tool 400 can include sets of alignment features 402 positioned on two sides of the assembly tool 400. As described above, the distance between sets of alignment features 402 on the assembly tool 400 can correspond to the distance between a set of alignment holes 300 on the holder tube 110. The sets of alignment features 402 may interact with the set of alignment holes 300 to hold the assembly tool 400 in alignment in the holder tube 110 with a blind connector assembly 104. When interacting with the set of alignment holes 300, the sets of alignment features 402 may provide feedback, such as haptic and audio feedback, indicating the assembly tool 400 is aligned with a blind connector assembly 104.

The sets of alignment features 402 may disengage from the set of alignment holes 300 in response to a force on the assembly tool 400. For example, a force pushing the assembly tool 400 further into the holder tube 110 can cause such disengagement. The feedback may allow a user of the assembly tool 400 to know which blind connector assembly 104 the assembly tool 400 is aligned with. For example, a user may insert the assembly tool 400 into the holder tube 110 until a first feedback indicates an alignment with a first blind connector assembly 104 or push the assembly tool 400 further into the holder tube 110 until feedback indicates an alignment with a second blind connector assembly 104, a third blind connector assembly 104, and so on.

Figure 6C:
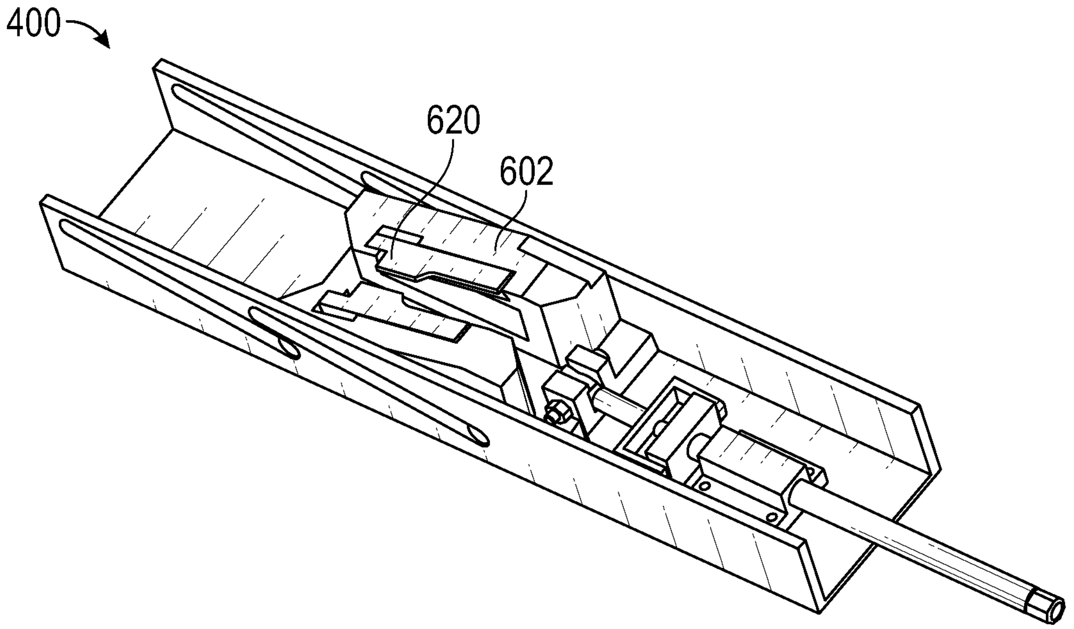
FIG. 6C illustrates a disassembly tool according to an embodiment.

FIG. 6C illustrates a disassembly tool 650 according to an embodiment. The disassembly tool 650 can be used to disconnect a connector assembly 104 from a computing tile. As illustrated, the disassembly tool 650 can include a disassembly catch 620. The disassembly catch 620 can be positioned on the push block 602. The disassembly catch 620 can include springs, such as torsion springs. The disassembly catch 620 can interact with the adjustor 252, allowing the disassembly tool 650 to pull the blind connector assembly 104 downward. For example, the disassembly catch 620 can allow the disassembly tool 650 to disconnect a blind connector assembly 104 from a computing tile. In some instances, the catch 620 can be added to the assembly tool 400 to implement a disassembly tool 650. In certain applications, a single tool can both connect and disconnect a connector assembly 104 and a computing tile.

Figure 7A:
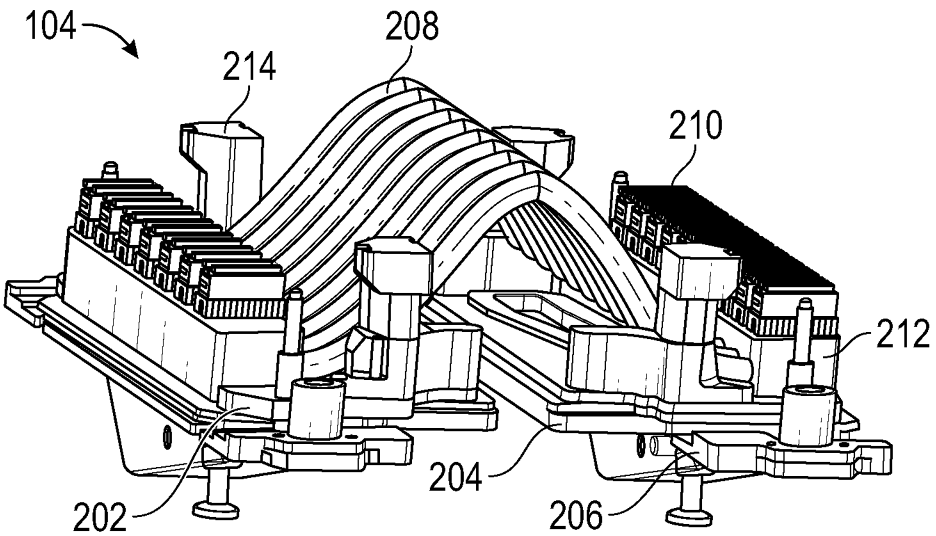

FIG. 7A illustrates a blind connector assembly 104 according to an embodiment. Blind connector assembly 104 illustrated in FIG. 7A can include a Y-adjustment plate 202, an X-adjustment plate 204, a Z-adjustment plate 206, X-finders 214, a connector housing 212, tile connectors 210, and connector cables 208, such as those discussed in FIG. 2A.

Figure 7B:
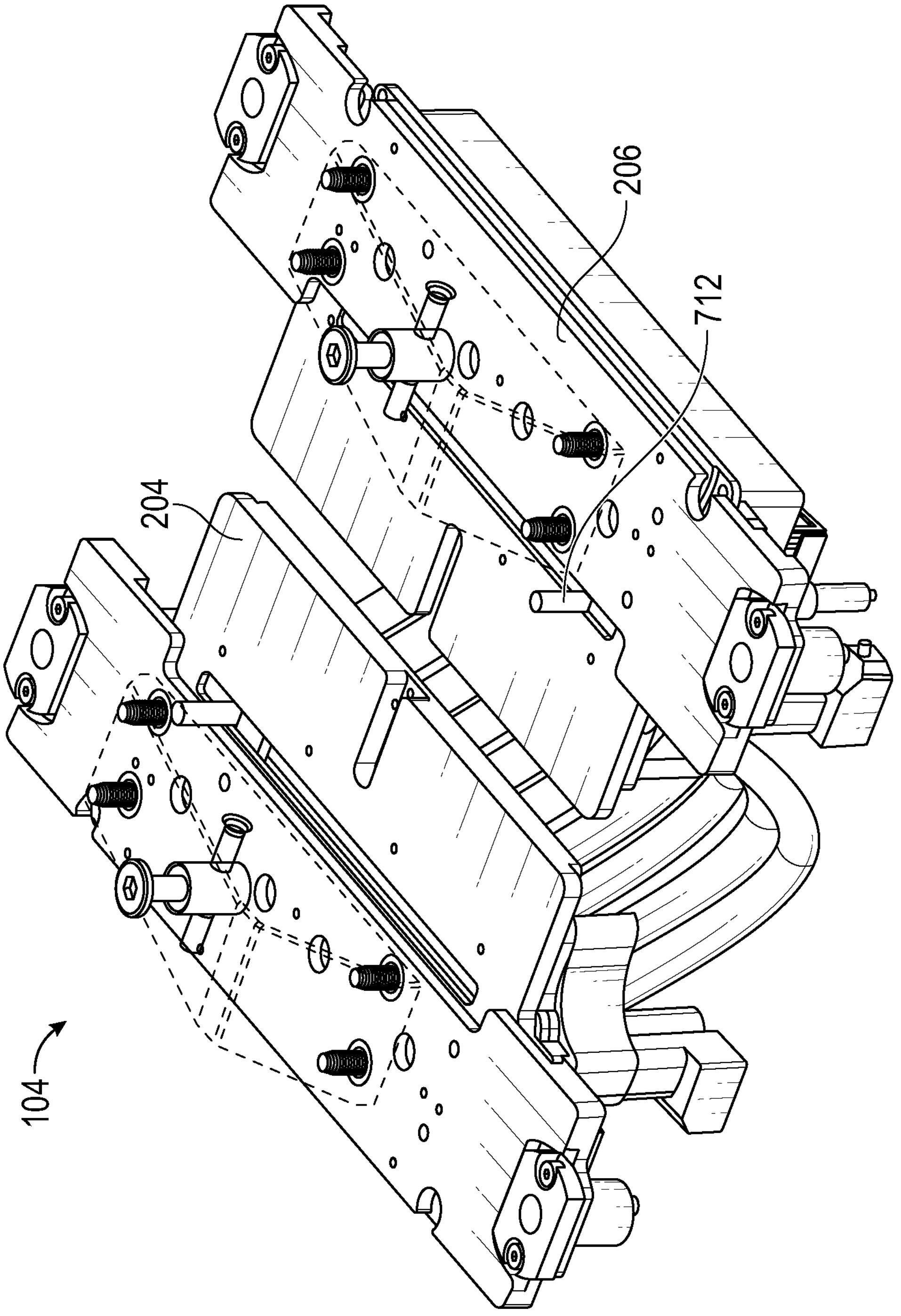

FIG. 7B illustrates a bottom view of a blind connector assembly 104 according to an embodiment. FIG. 7B shows the blind connector assembly 104 upside down relative to FIG. 7A. As illustrated, an adjustment pin 712 can extent from the bottom of each half of the blind connector assembly 104. The adjustment pin 712 can allow the half of the blind connector assembly 104 to be adjusted in one or more directions.

FIG. 7C illustrates an exploded view of the blind connector assembly 104 according to an embodiment.

Figure 7D:
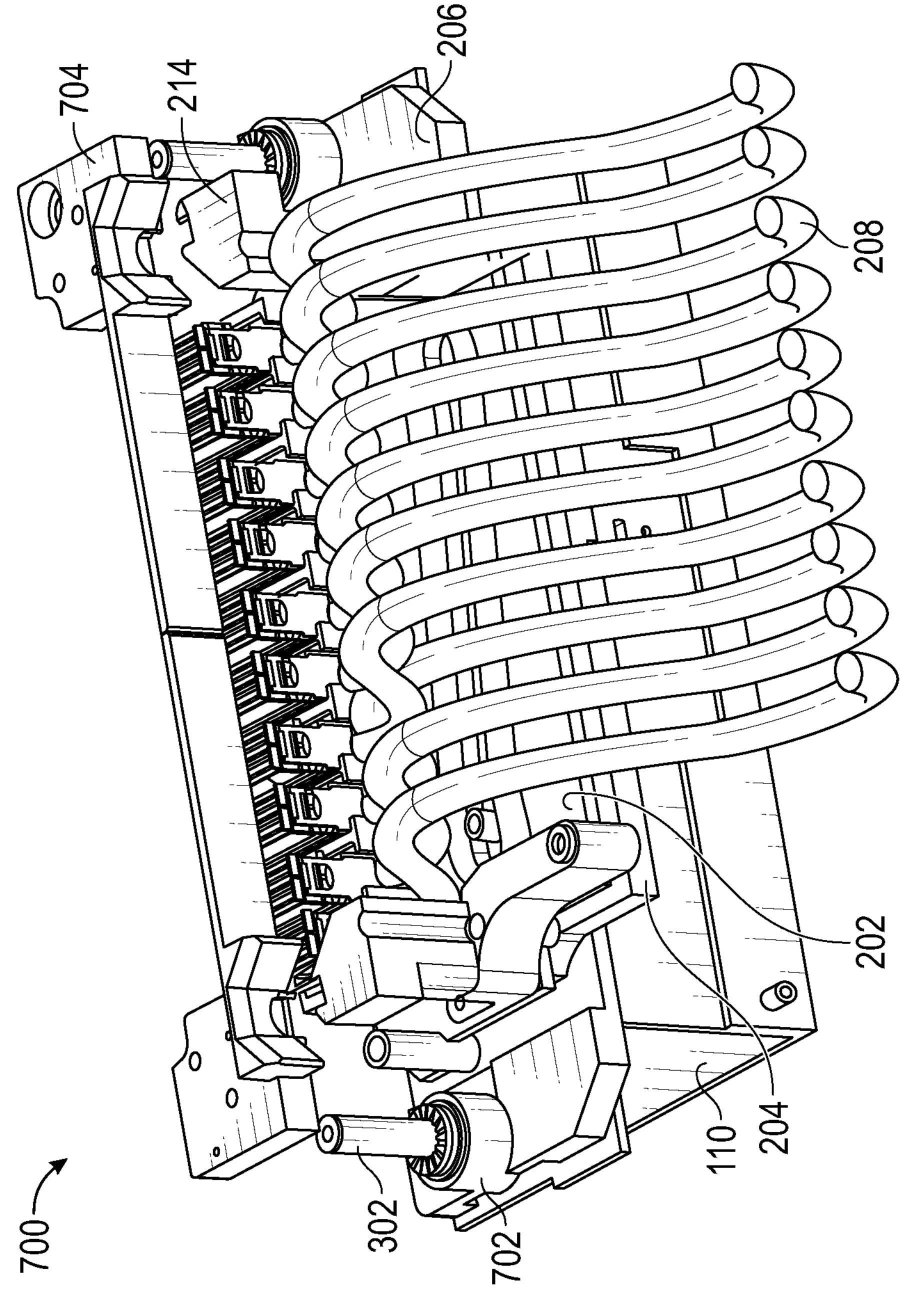

FIG. 7D illustrates a perspective view of blind connector half 700. Blind connector half 700 can be one half of the blind connector assembly 104 of FIGS. 7A-7C. As discussed above, each half of the blind connector assembly 104, such as shown by blind connector half 700, can include an X-adjustment plate 204, a Y-adjustment plate 202, and a Z-adjustment plate 206. As illustrated blind connector half 700 can additionally include a linear bearing system 702, X-finders 214, and a tile guide 704. The blind connector half 700 can be positioned on the holder tube 110 such that a set of alignment pins 302 extends through the linear bearing system 702. The tile guide 704 can help facilitate the alignment of the blind connector half 700 to connectors positioned on a computing tile. The X-finders 214 can help facilitate the adjustment of the blind connector half 700 along a dimension. Features of the blind connector half 700 enable a blind connector assembly 104 to independently connect computing tile connectors 210 on opposing sides of the blind connector assembly to respective computing tiles.

Figure 7E:
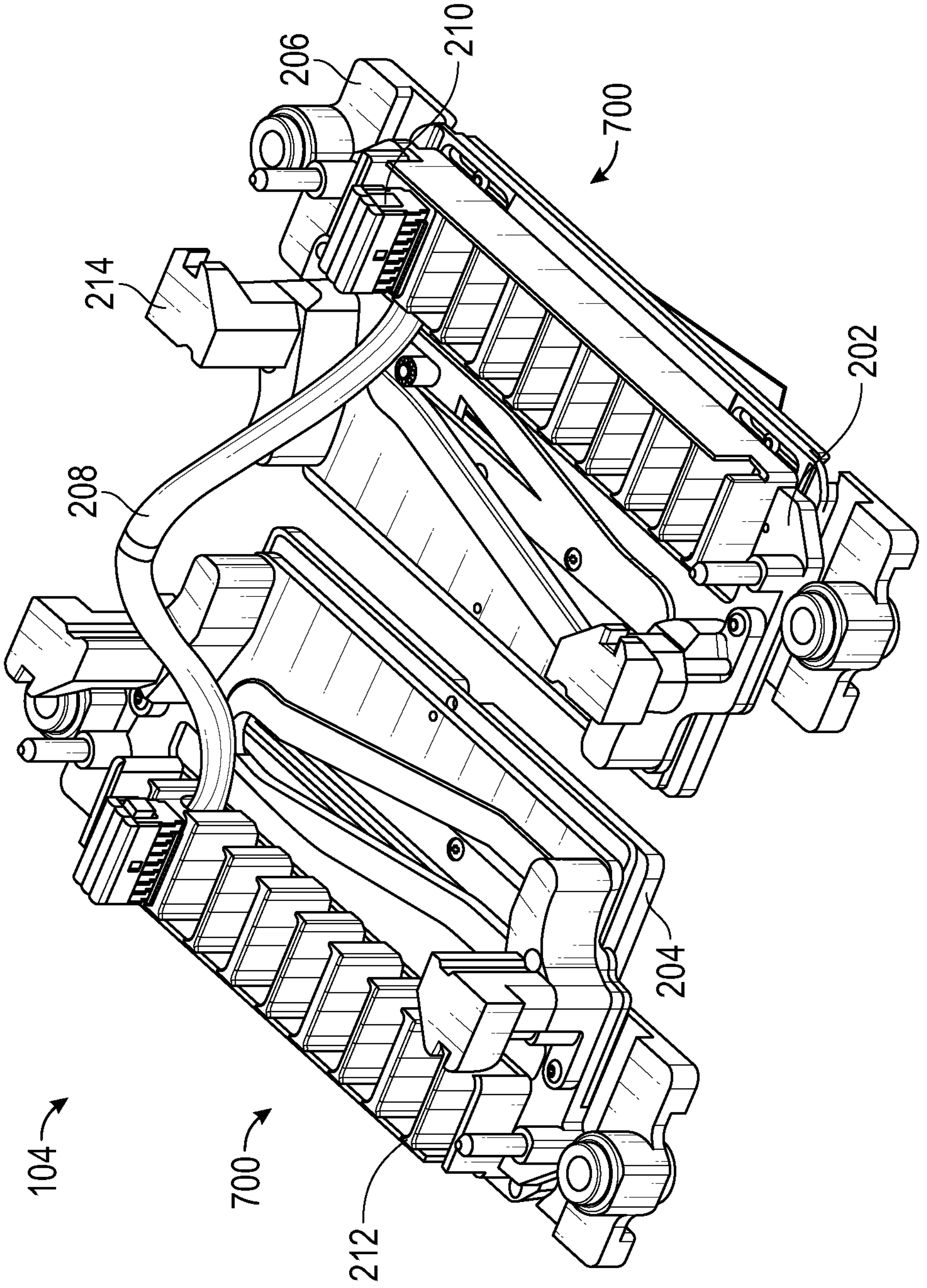
Figure 7F:
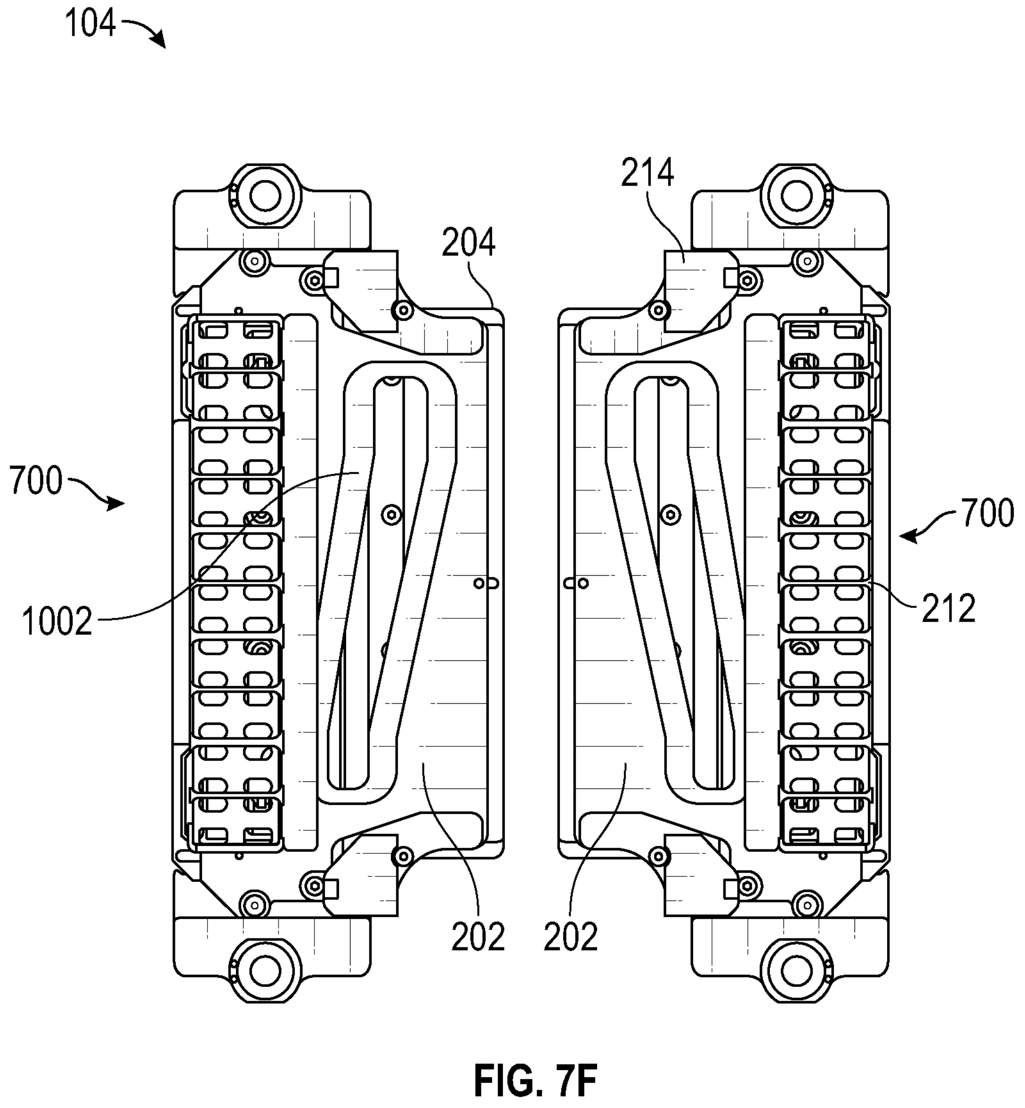

FIG. 7E illustrates a perspective view of a blind connector assembly 104 with a single computing tile connector 210 pair in the connector housing 212 connected by a connector cable 208. The connector cable 208 spans from a first blind connector half 700 to a second blind connector half 700. FIG. 7F illustrates a top view of a blind connector assembly 104 with the computing tile connectors 210 and connector cable 208 omitted. As illustrated in FIGS. 7E and 7F, the blind connector halves 700 of a blind connector assembly 104 can be mirror images along a first dimension.

Figure 8A:
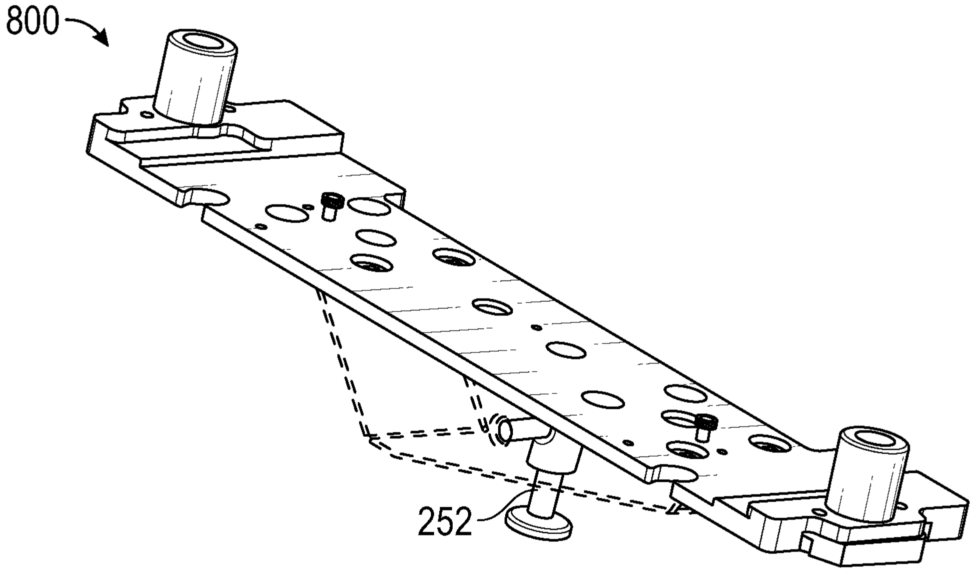
FIG. 8A illustrates a Z-adjustment plate according to an embodiment.

FIG. 8A illustrates Z-adjustment plate 800 according to an embodiment. Z-adjustment plate 800 can correspond to the Z-adjustment plate 206 of FIG. 7A, for example. Z-adjustment plate 800 can include an adjustor 252.

Figure 8B:
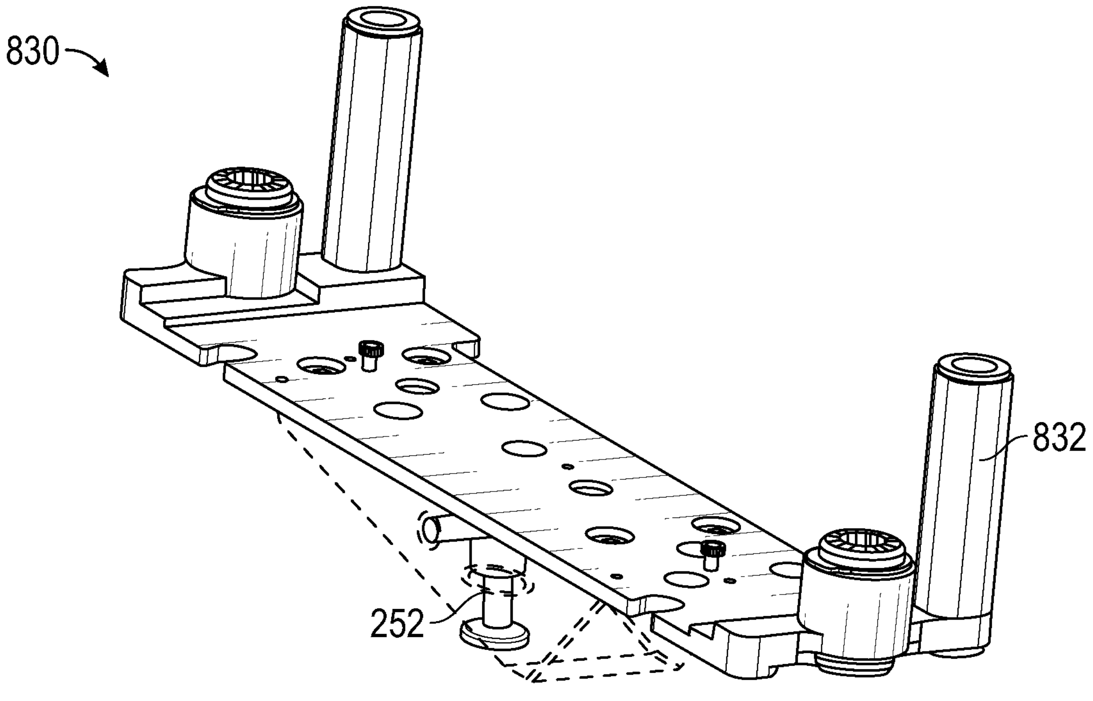
FIG. 8B illustrates a Z-adjustment plate according to another embodiment.

FIG. 8B illustrates Z-adjustment plate 830 according to an embodiment. Z-adjustment plate 830 can correspond to the Z-adjustment plate 206 of FIG. 7A, for example. Z-adjustment plate 830 can include an adjustor 252 and physical connection 832. Physical connection 832 can couple a component to the Z-adjustment place 830, such as a tile guide 704 of FIG. 7D, for example.

Figure 8C:
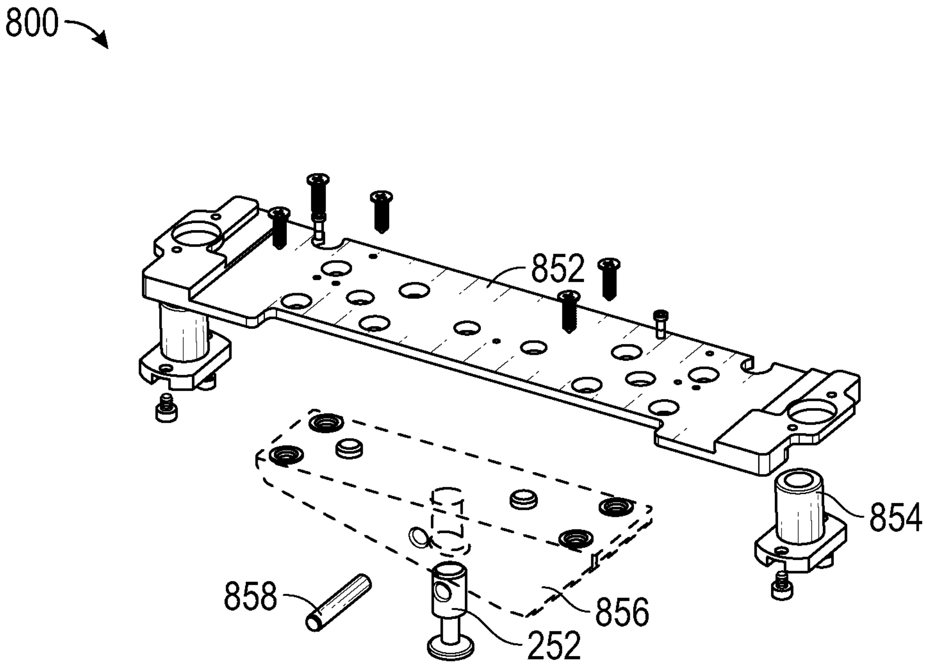
FIG. 8C is an exploded view of the Z-adjustment plate of FIG. 8A.

FIG. 8C illustrates an exploded view of Z-adjustment plate 800 of FIG. 8A. As illustrated, Z-adjustment plate 800 can include structure plate 852, wedge block 856, adjustor 252, secure pin 858, and alignment pin holders 854. The structure plate 852 can provide structural support for the Z-adjustment plate 800. In some embodiments the structure plate 852 can provide the base plate for a blind connector half 700. The wedge block 856 can be attached to the bottom of the structure plate 852. The wedge block 856 and the adjustor 252 can interact with the assembly tool 400 to move the z-adjustment plate 800 along a dimension to connect and/or disconnect the blind connector half 700. The secure pin 858 can hold the adjustor 252 in place on the wedge block 856.

Figure 9A:
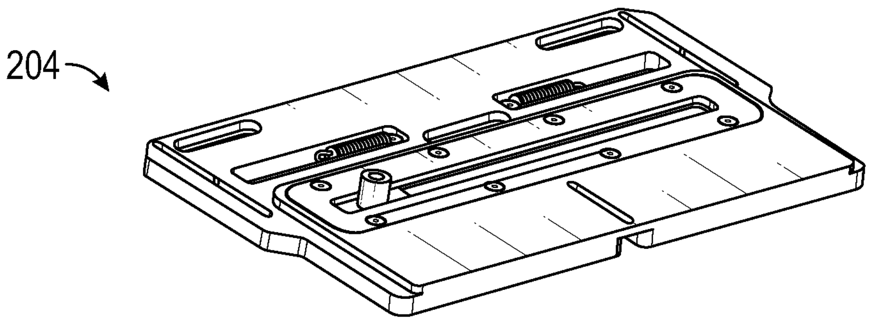
FIG. 9A is a perspective view of an X-adjustment plate according to an embodiment.
Figure 9B:
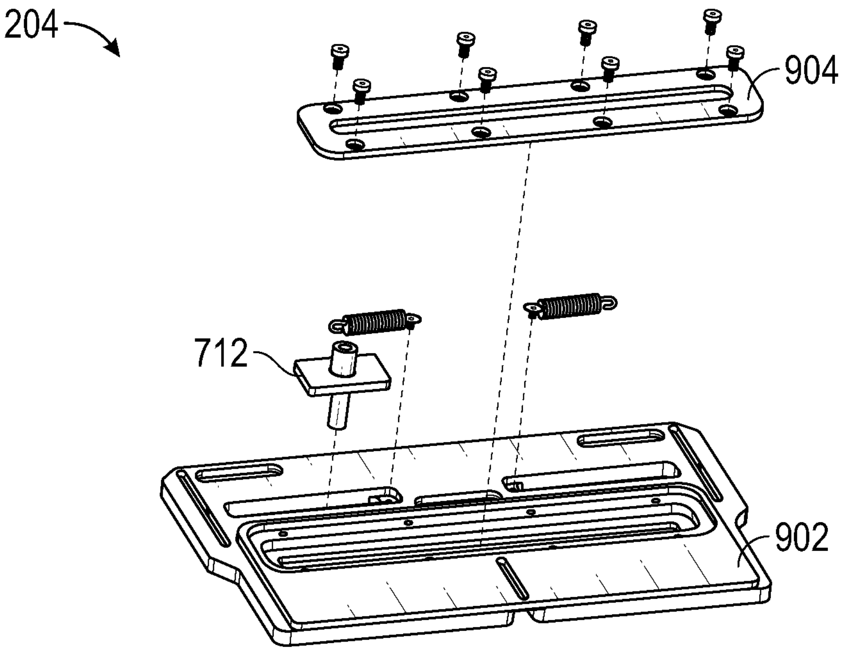
FIG. 9B is an exploded view of the X-adjustment plate of FIG. 9A.

FIGS. 9A and 9B illustrate an X-adjustment plate 204 according to an embodiment. FIG. 9A illustrates a perspective view of the X-adjustment plate 204. FIG. 9B illustrates an exploded view of the X-adjustment plate 204. As illustrated, the X-adjustment plate 204 can include a X-cam 904 and a structure plate 902, The structure plate 902 can provide structural support for the X-adjustment plate 204. The X-cam 904 can be attached to the structure plate 902. The adjustment pin 712 can extend through the X-cam 904 and structure plate 902.

Figure 10A:
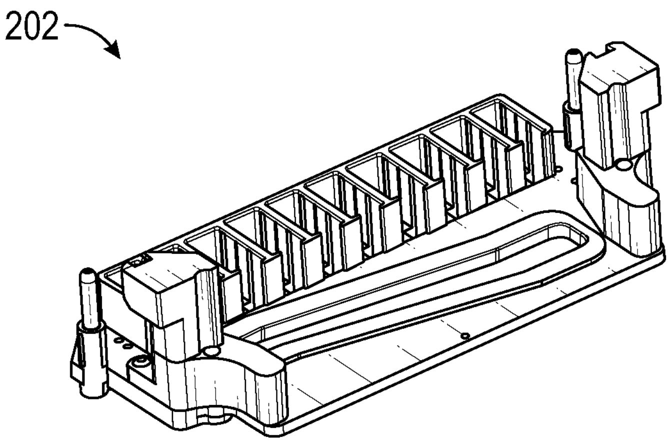
FIG. 10A is a perspective view of a Y-adjustment plate according to an embodiment.
Figure 10B:
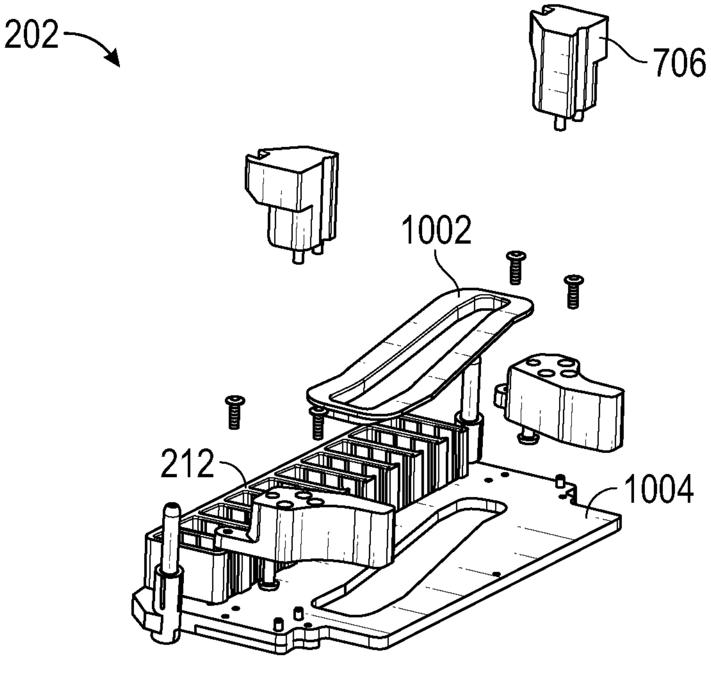
FIG. 10B is an exploded view of the Y-adjustment plate of FIG. 10A.

FIGS. 10A and 10B illustrate a Y-adjustment plate 202 according to an embodiment. FIG. 10A illustrates a perspective view of the Y-adjustment plate 202. FIG. 10B illustrates an exploded view of the Y-adjustment plate 202. As illustrated, Y-adjustment plate 202 can include X-finders 214, a Y-pullback cam 1002, a connector housing 212, and a structure plate 1004. The structure plate 1004 can provide structural support for the Y-adjustment plate 202. The X-finders 214, Y-pullback cam 1002, and connector housing 212 can be attached to the structure plate 1004. The connector housing 212 can physically couple connectors, such as the computing tile connectors 210 of FIG. 2A, for example. An adjustment pin 712 (not shown in FIGS. 10A and 10B) can extend through the structure plate 1004 and Y-pullback cam 1002. When the adjustment pin 712 travels along the Y-pullback cam 1002, the adjustment pin 712 can move the Y-adjustment plate 202 along a dimension.

Figure 11A:
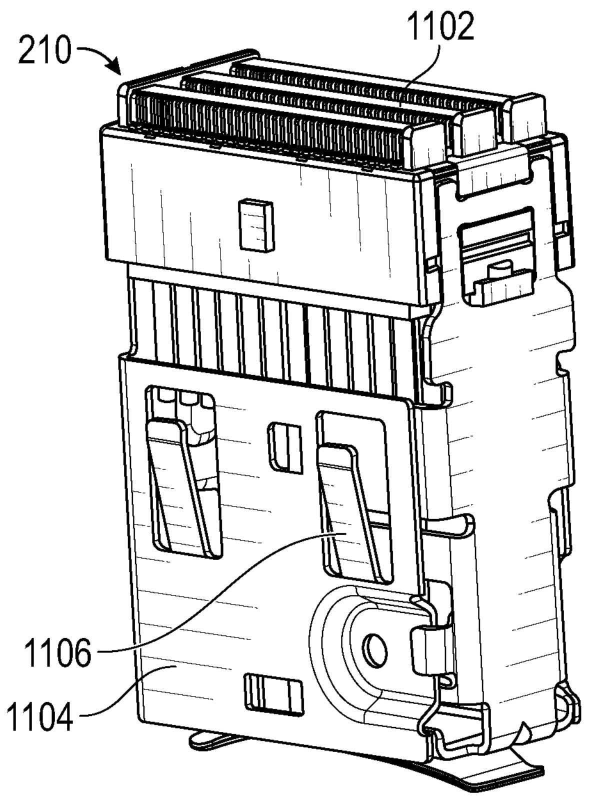
FIG. 11A is a perspective view of a computing tile connector according to an embodiment.

FIG. 11A illustrates a computing tile connector 210 according to an embodiment. As illustrated, computing tile connector 210 can include connection interface 1102, casing 1104, and springs 1106. The connection interface 1102 can provide electrical and physical coupling to a corresponding connector on a computing tile. The physical coupling can include resistive force. For example, some force may be applied to physically couple and decouple the connection interface 1102 to a corresponding connector on a computing tile. The casing 1104 can provide physical structure for the computing tile connector 210. The springs 1106 can be positioned on the casing 1104. The springs 1106 can hold the computing tile connector 210 in place in a connector housing 212. The springs 1106 can allow for fine adjustments to be applied to each computing tile connector 210 in multiple directions (e.g., x, y, and z directions). For example, the springs 1106 can allow for the computing tile connector 210 to be adjusted in three orthogonal directions so the connection interface 1102 is aligned with a corresponding connector on a computing tile.

Figure 11B:
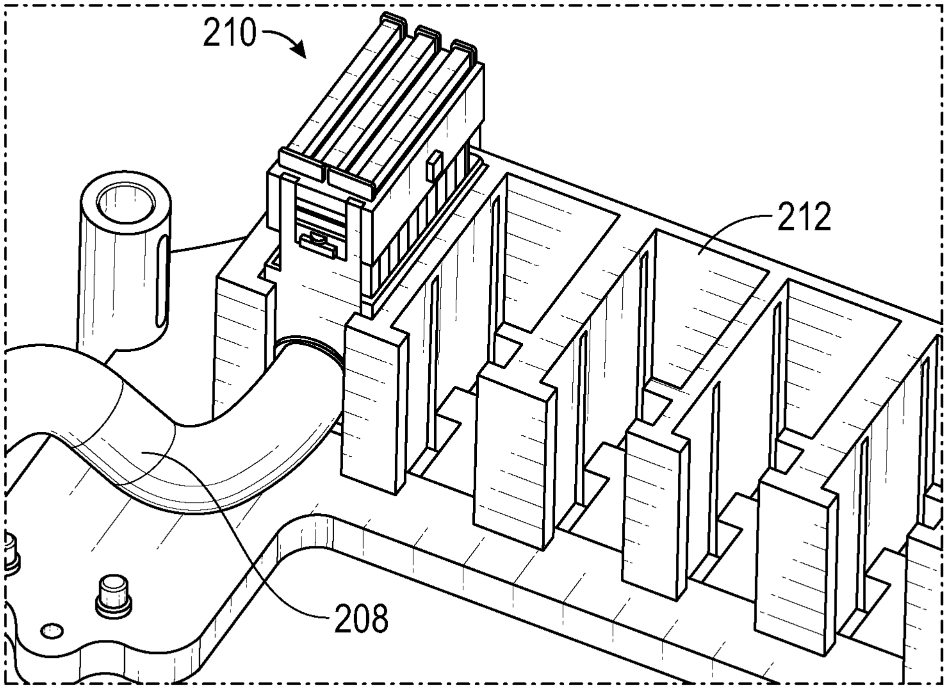
FIG. 11B illustrates the computing tile connector of FIG. 11A inserted into a connector housing according to an embodiment.

FIG. 11B illustrates a computing tile connector 210 inserted into a connector housing 212 according to an embodiment. As illustrated, the computing tile connector 210 can be connected to a connector cable 208. The computing tile connector 210 and connector cable 208 can be inserted into the connector housing 212.

Figure 11C:
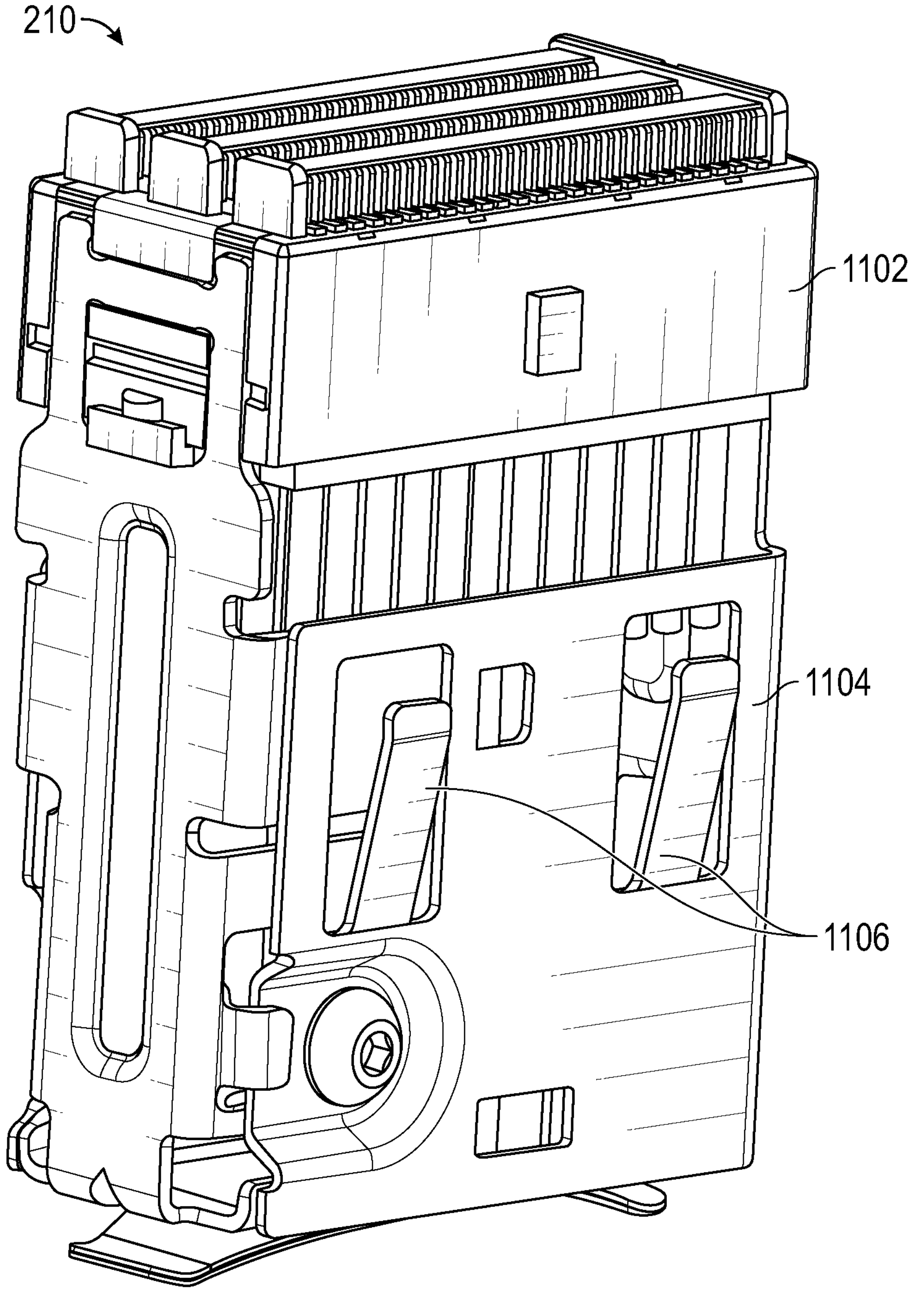
FIG. 11C is a different perspective view of the computing tile connector of FIG. 11A.

FIG. 11C illustrates another view of the computing tile connector 210 according to an embodiment. The computing tile connector 210 illustrated in FIG. 11C can be the computing tile connector 210 of FIG. 11A and can include similar or the same components described in FIG. 11A.

Figure 11D:
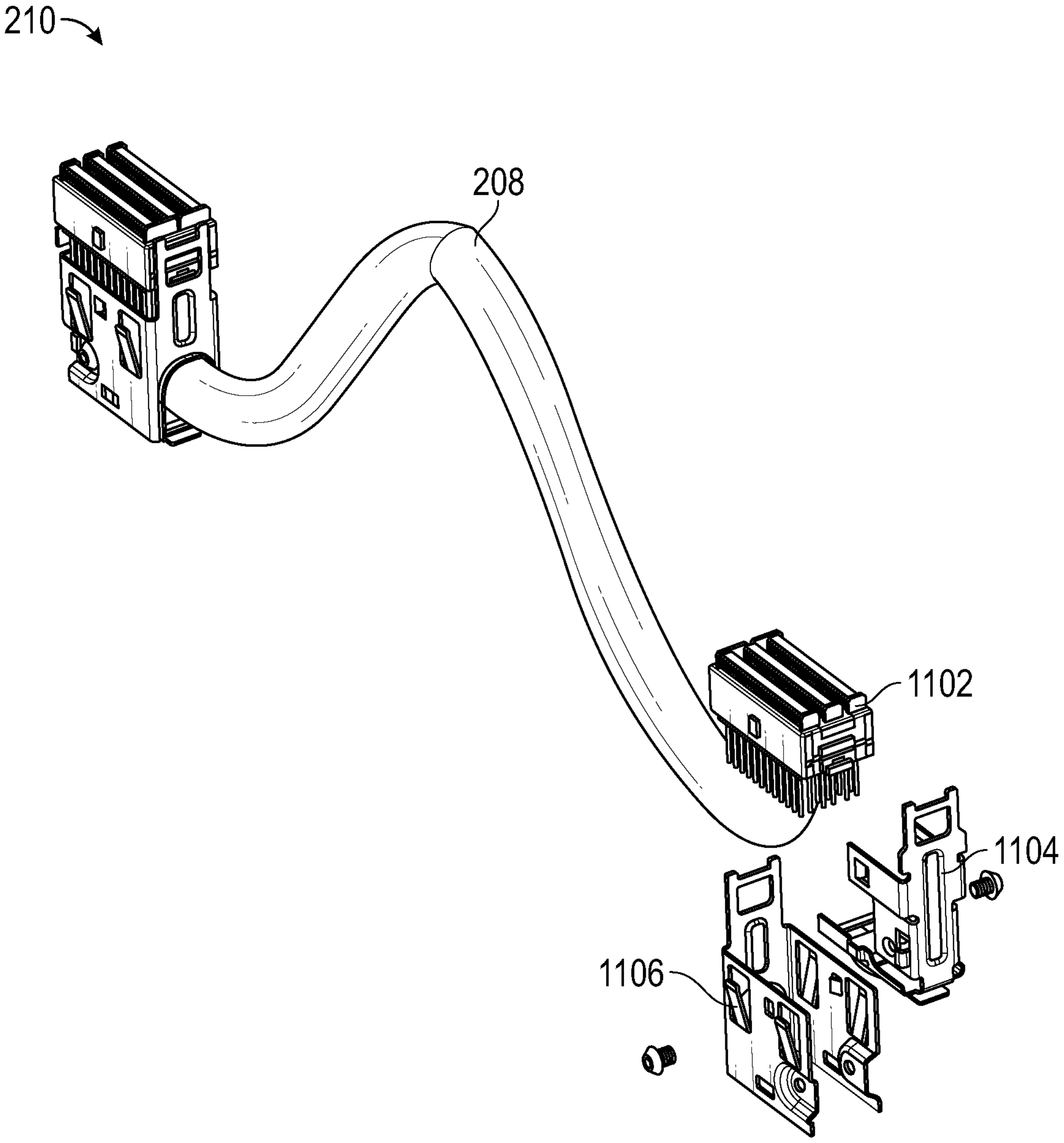
FIG. 11D illustrates a connector cable with computing tile connectors attached to each side of the connector cable according to an embodiment.

FIG. 11D illustrates a connector cable 208 with computing tile connectors 210 attached to each side of the connector cable 208.

Figure 12:
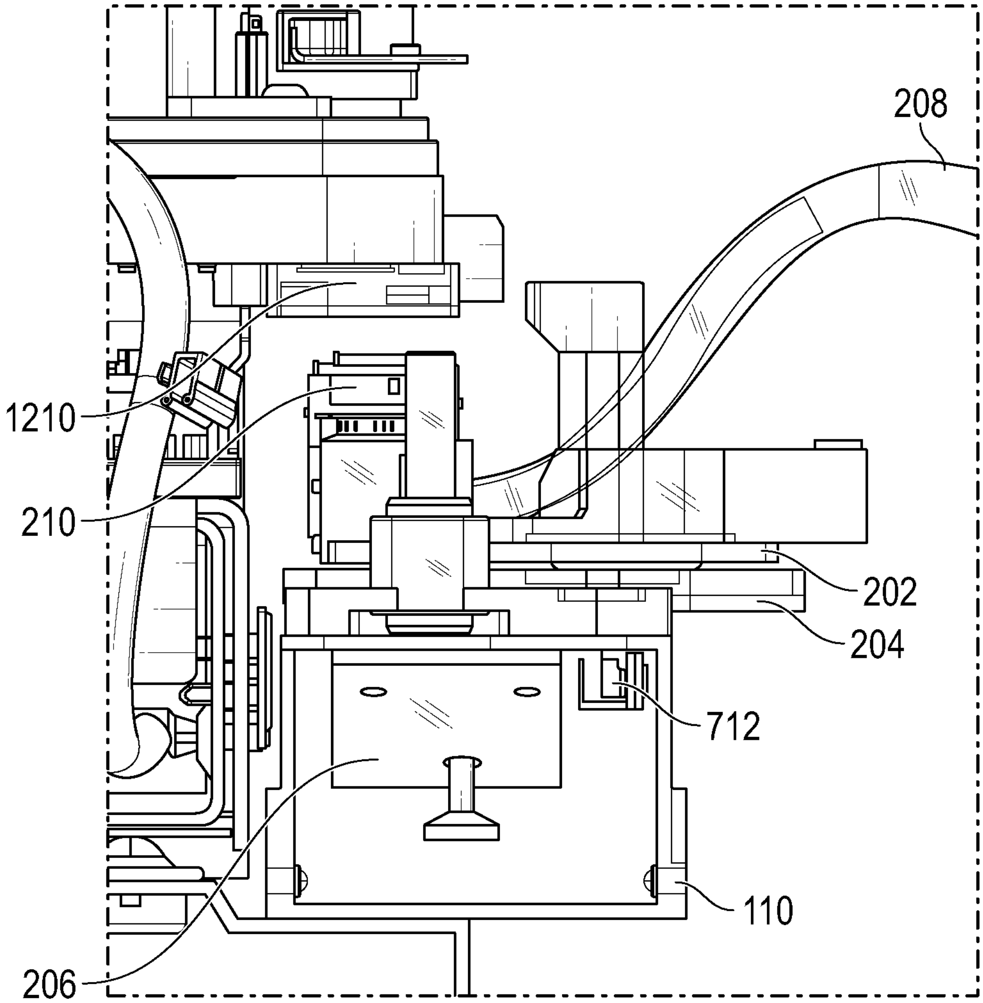
FIG. 12 illustrates a side or cross sectional view of a blind connector in a cabinet according to an embodiment.

FIG. 12 illustrates a cross section of a blind connector in a cabinet according to an embodiment. FIG. 12 illustrates a half of the blind connector in one cabinet. The half of the blind connector can be the blind connector half 700 of FIG. 7D, for example. As illustrated, the half of the blind connector can be positioned on a holder tube 110 below a tile connection interface 1210. The connection interface 1210 include be connectors on a computing tile configured to receive the computing tile connectors 210 of a blind connector assembly 104. As illustrated, the half of the blind connector can include a Z-adjustment plate 206, a Y-adjustment plate 204, a Z-adjustment plate 206, connector cable 208 extending towards another half of the blind connector, an adjustment pin 712, and computing tile connectors 210. The adjustment pin 712 and the Z-adjustment plate 206 can each have an end inside the holder tube 110 such that the adjustment pin 712 and the Z-adjustment plate 206 can interact with the assembly tool 400.

FIGS. 13A-13C illustrate an assembly process for assembling a blind connector assembly, such as a blind connector assembly 104 according to an embodiment. As illustrated in FIG. 13A, at step 1, an X-adjustment plate, such as X-adjustment plate 204, is attached to a Z-adjustment plate, such as Z-adjustment plate 206. As illustrated in FIG. 13B, at step 2, the Y-adjustment plate, such as Y-adjustment plate 202, is attached. As illustrated in FIG. 13C, at step 3, cables, such as connector cable 208, and computing tile connectors, such as computing tile connectors 210, are attached.

Figure 14B:
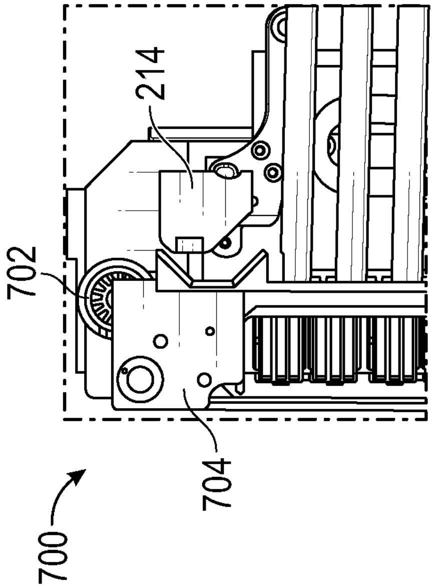
FIGS. 14A-14C illustrate an alignment of a blind connector half according to an embodiment.
Figure 14C:
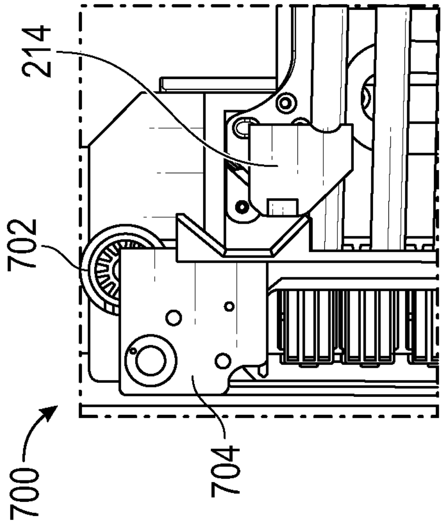
Figure 14A:
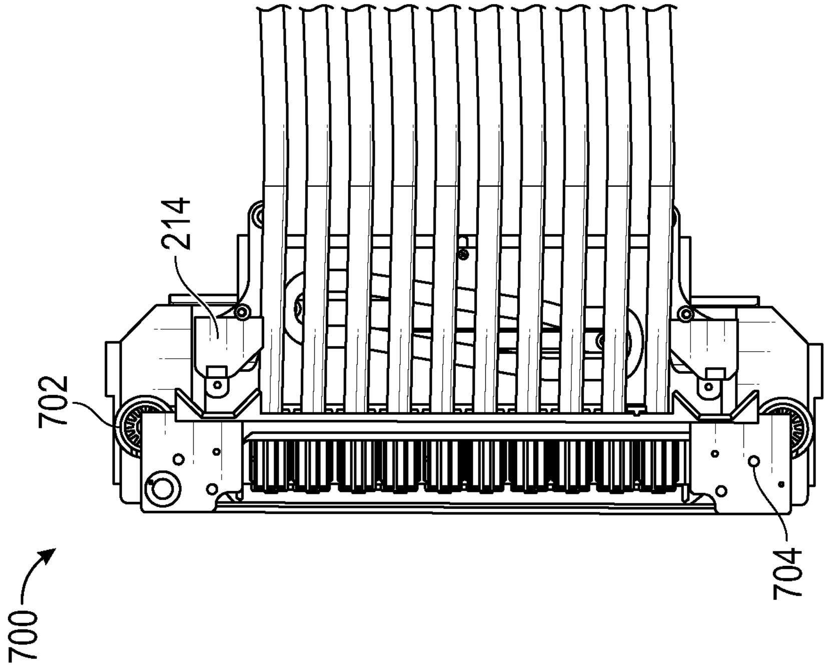

FIGS. 14A-14C illustrate aligning a blind connector half 700 according to an embodiment. As described above, the X-finders 214 can help facilitate the alignment of a blind connector half 700 along one or more dimensions. FIG. 14A illustrates a blind connector half 700 with the X-finders 214 positioned neutrally relative to the tile guide 704. In some instances, this neutral position may be adjusted prior to a connection of the blind connector half 700 to a computing tile connector. For example, there could be a slight misalignment of the blind connector half 700 and the computing tile in the neutral position. The blind connector half 700 can be adjusted from the neutral position (e.g. using an X adjustment plate 204). FIG. 14B illustrates the blind connector half 700 adjusted such that the X-finder 214 is in a first position on a dimension relative to the tile guide 704 and FIG. 14C illustrates the blind connector half 700 adjusted such that the X-finder 214 is in a second position relative to the 704 in an opposite direction of dimension.

Figure 15B:
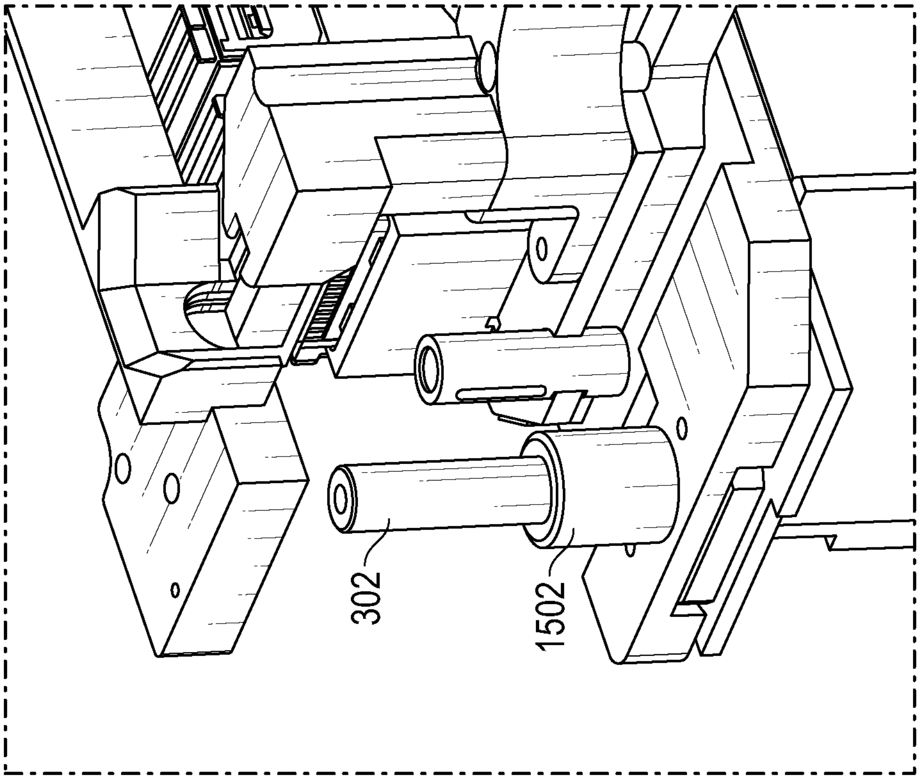
FIG. 15B illustrates a second embodiment of a blind connector assembly with the alignment pin extending through a pin housing.
Figure 15A:
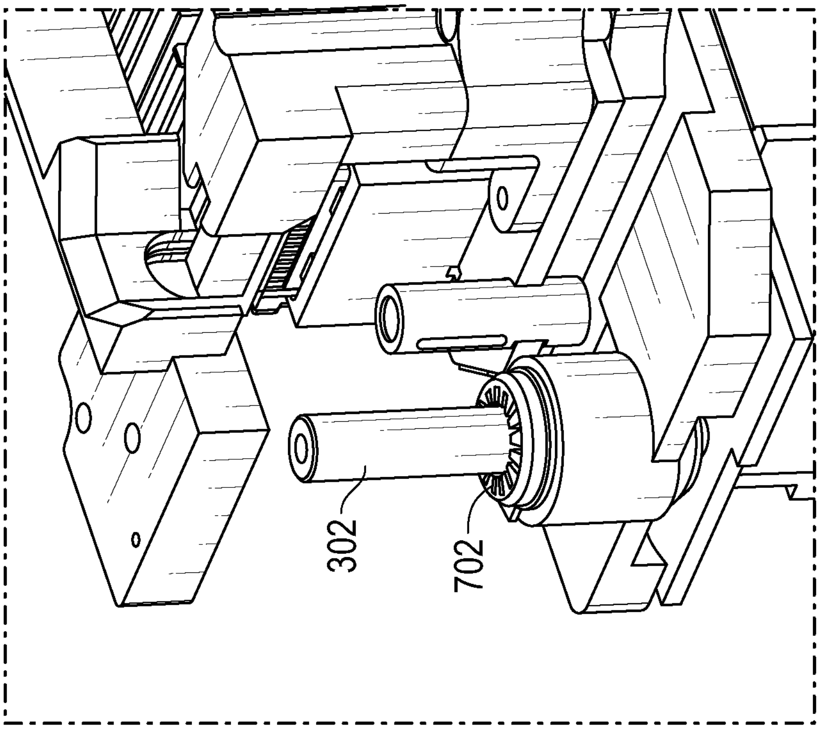
FIG. 15A illustrates a first embodiment of a blind connector assembly with an alignment pin extending through a linear bearing system.

FIGS. 15A and 15B illustrate an alignment pin 302 extending through a blind connector half 700 according to embodiments. FIG. 15A illustrates a first embodiment with the alignment pin 302 extending through a linear bearing system 702. FIG. 15B illustrates a second embodiment with the alignment pin 302 extending through a pin housing 1502.

Blind Connector Assembly With Y-Pullback

As discussed above, high performance in computing can be significantly constrained by signal integrity of high-speed signals. Close proximity of computing nodes can be significant to achieving desirable signal integrity for high-speed signals. As such, the distance between computing components, such as computing tiles, within a cabinet can effect the computing capabilities of the cabinet and/or computing system. Accordingly, space within a cabinet may be limited.

The blind connectors described herein can accommodate the limited space within a cabinet by providing a Y-pullback of a blind connector. The Y-pullback can move a blind connector into a retracted position. While the blind connector is in a retracted position, the cabinet may have sufficient space for system trays that include an array of connected computing tiles to be inserted into the cabinet. When the blind connector is in place for connecting to a computing tile, the blind connector can return to an un-retracted position.

Figure 16:
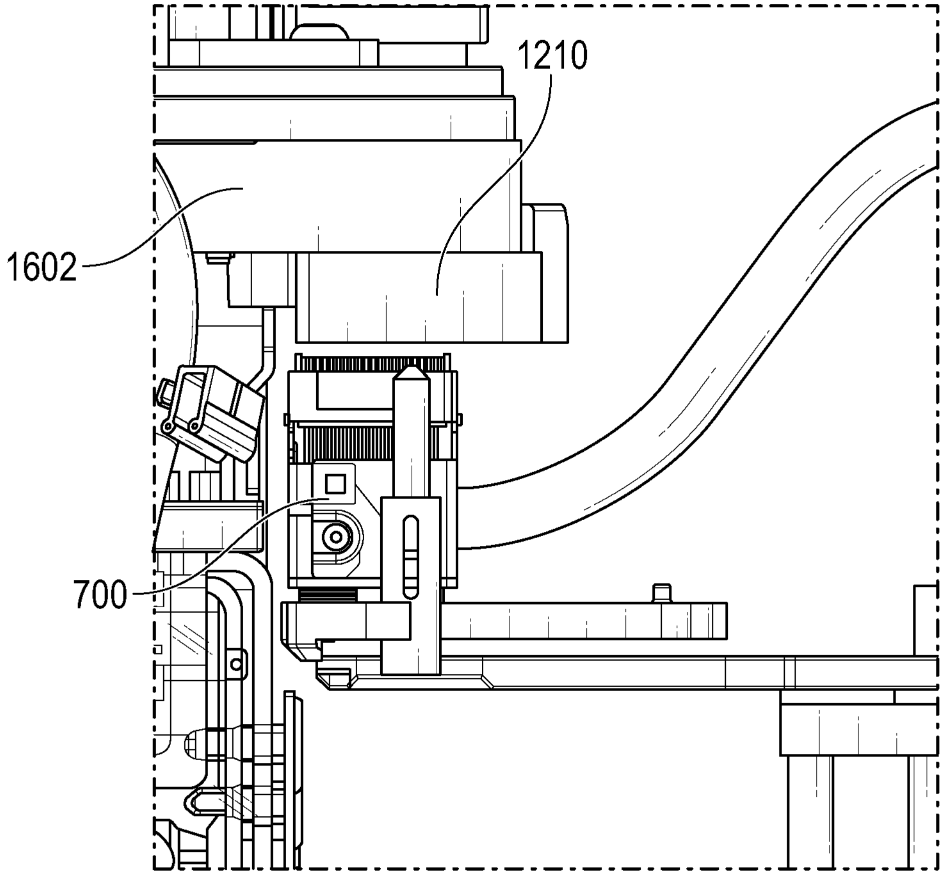
FIG. 16 illustrates a blind connector half positioned in a cabinet according to an embodiment.

FIG. 16 illustrates a blind connector half 700 positioned in a cabinet according to an embodiment. As illustrated, the blind connector half 700 is shown positioned beneath a tile connection interface 1210 on a system tray 1602. The position of the blind connector half 700 may impede or prevent the system tray 1602 from being removed from the cabinet. For example, one or more components of the system tray 1602 may come in contact and/or collide with the blind connector half 700 if a user attempts to remove the system tray 1602. Similar technical challenges can be present for inserting a system tray 1602 into the cabinet.

Figure 17B:
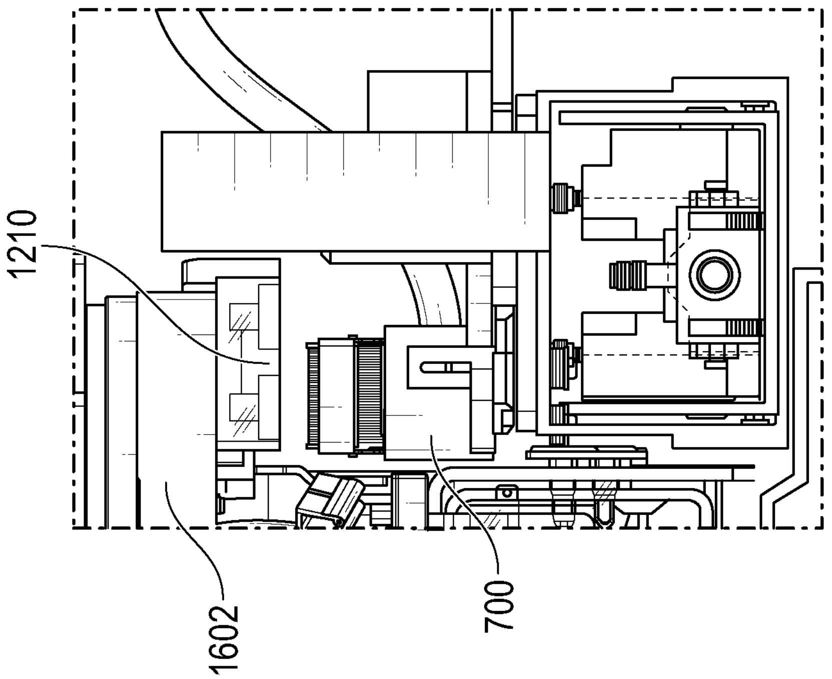
FIGS. 17A-17E illustrate Y-pullback on a blind connector half according to an embodiment.
Figure 17A:
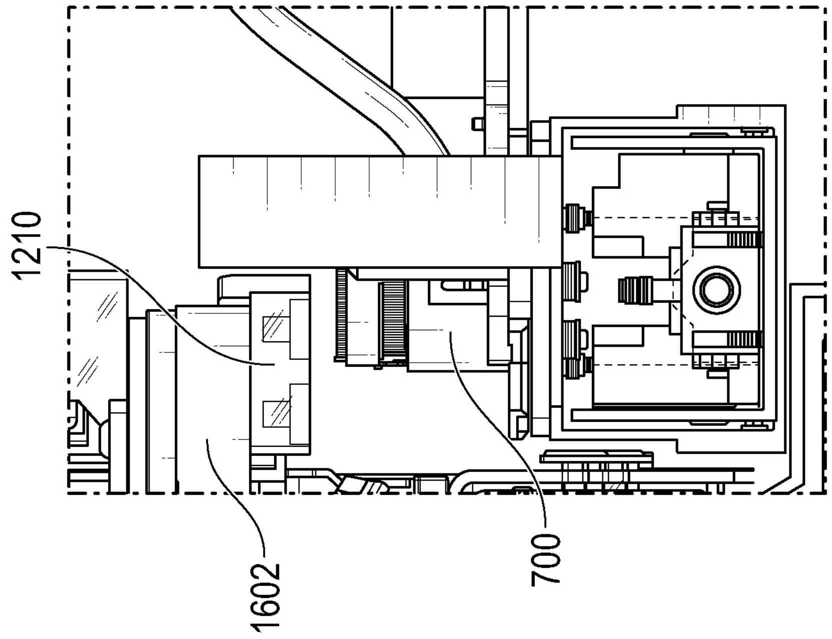

FIGS. 17A-17E illustrate Y-pullback on a blind connector half 700 according to an embodiment. Y-pullback can be independently performed on each blind connector half of a connector assembly. Referring to FIG. 17A, the blind connector half 700 is illustrated in a first position. In the first position, the blind connector half 700 is pulled back away from the system tray 1602 and out of alignment from the tile connection interface 1210. There is clearance between the blind connector half 700 and the system tray 1602 in the first position. When the blind connector half 700 is in the first position, the system tray 1602 can be inserted into and/or removed from the cabinet without colliding with the blind connector half 700. The first position can be referred to as a Y-pullback position.

Referring to FIG. 17B, the blind connector half 700 is illustrated in a second position. The second position in FIG. 17B may be a transitional state between the first position of FIG. 17A and a third position of FIG. 17C. In the second position, the blind connector half 700 is positioned in close proximity to the system tray 1602 and in alignment with the tile connection interface 1210. When the blind connector half 700 is in the second position, the system tray 1602 may collide with the blind connector half 700 if the system tray 1602 is removed from or inserted into the cabinet.

Figure 17C:
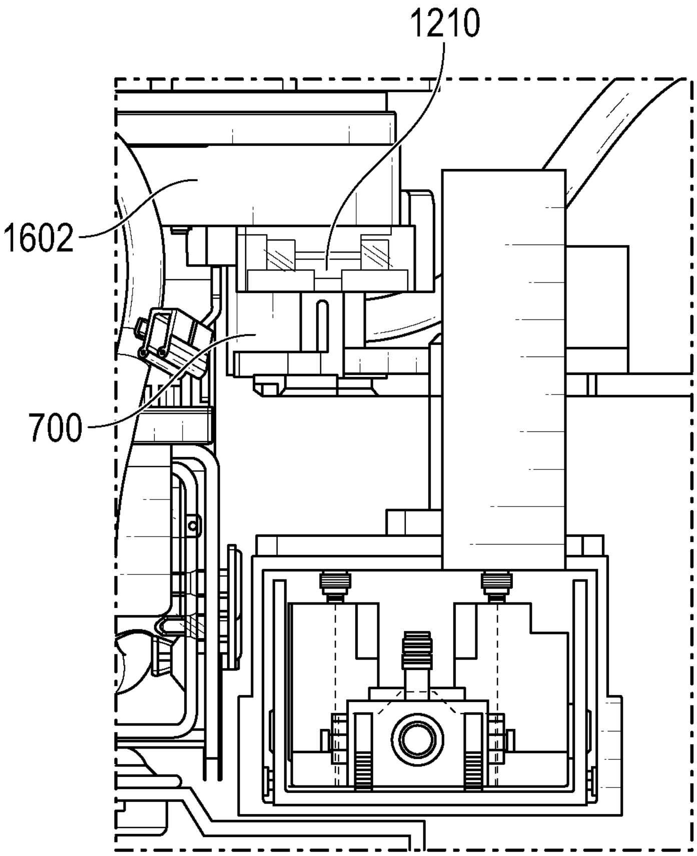

Referring to FIG. 17C, the blind connector half 700 is illustrated in a third position. In the third position, the blind connector half 700 is connected to the tile connection interface 1210 such that the blind connector half 700 is electrically and physically coupled to the tile connection interface 1210.

Figure 17E:
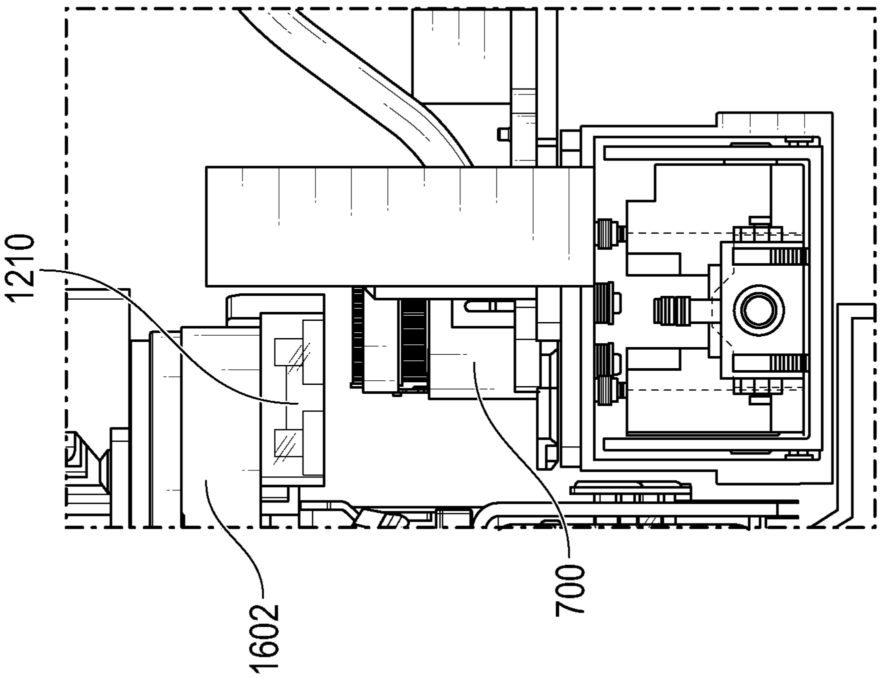
Figure 17D:
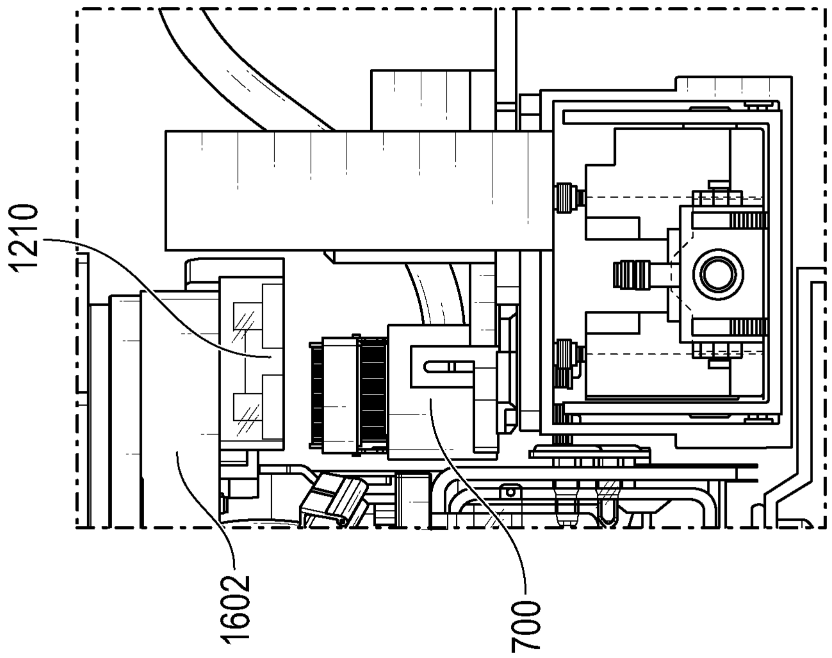

Referring to FIG. 17D, the blind connector half 700 is illustrated in a fourth position. The fourth in FIG. 17D may be a transitional state between the third position of FIG. 17C and a fifth position of FIG. 17E. The fourth position may be a similar position to the second position of FIG. 17B. In the fourth position, the blind connector half 700 is positioned in close proximity to the system tray 1602 and in alignment with the tile connection interface 1210. When the blind connector half 700 is in the fourth position, the system tray 1602 may collide with the blind connector half 700 if the system tray 1602 is removed from the cabinet.

Referring to FIG. 17E, the blind connector half 700 is illustrated in a fifth position. The fifth position may be a similar position to the first position of FIG. 17A. In the fifth position, the blind connector half 700 is pulled back away from the system tray 1602 and out of alignment from the tile connection interface 1210. This can provide clearance between the system tray 1602 and the blind connector half 700 in the y-direction. The fifth position can be referred to as a Y-pullback position. When the blind connector half 700 is in the fifth position, the system tray 1602 can be removed from the cabinet without colliding with the blind connector half 700.

Before a user inserts a system tray 1602 into a cabinet, the user can set the blind connector half 700 into the first position of FIG. 17A. For example, a user may use a tool, such as assembly tool 400, to move the blind connector half 700 into the first position. Once a system tray 1602 is inserted into a cabinet, a user can set the blind connector half 700 into the third position of FIG. 17C, such that the blind connector half 700 is connected to the tile connection interface 1210. For example, a user may use the tool to move the blind connector half 700 into the second position of FIG. 17B and use the tool to push up the blind connector half 700 into the third position.

Before a user removes a system tray 1602 into a cabinet, the user can use a tool, such as assembly tool 400, to remove the blind connector half 700 from the third position of FIG. 17C into the fourth position of FIG. 17D, such that the blind connector half 700 is disconnected from the tile connection interface 1210. From the fourth position, the user may use the tool to set the blind connector half 700 into the fifth position of FIG. 17E, such that the blind connector half 700 is out of the travel path of the system tray 1602. A user may then remove the system tray 1602 without the system tray 1602 colliding with the blind connector half 700.

Figure 18A:
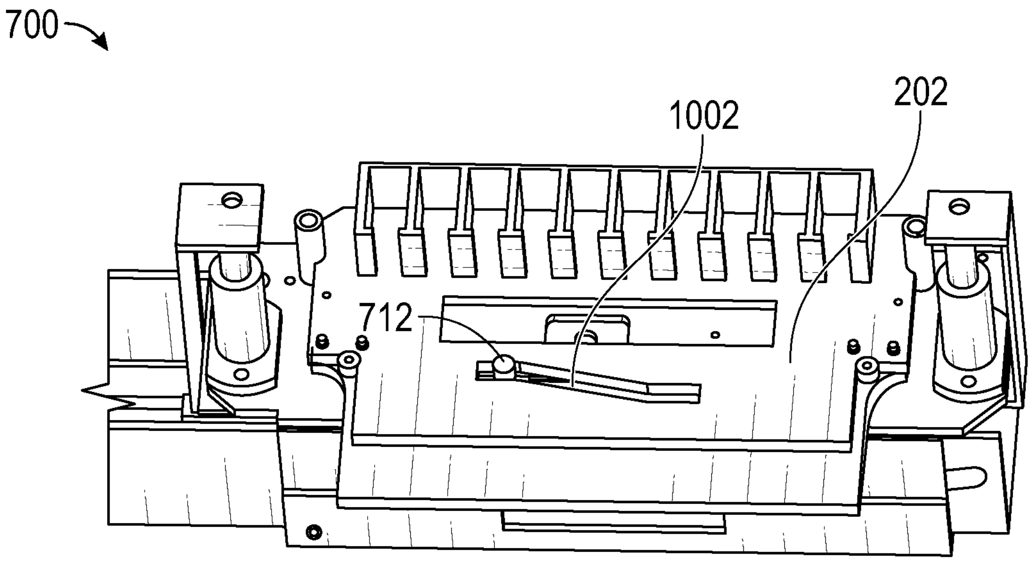
FIG. 18A is blind connector half with a Y-adjustment plate in a retracted position.
Figure 18B:
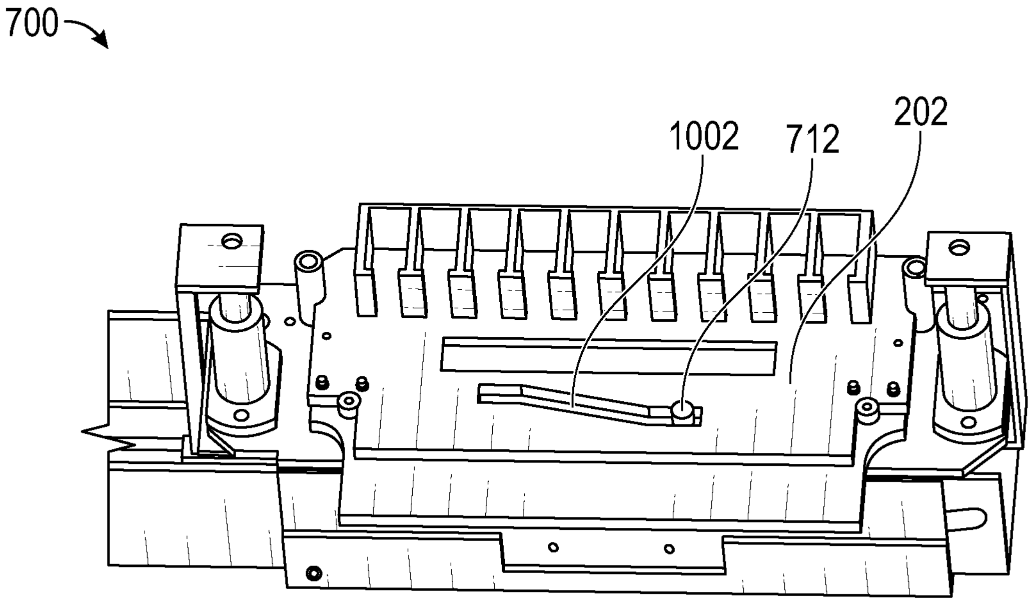
FIG. 18B is blind connector half with a Y-adjustment plate in a non-retracted position.

FIGS. 18A and 18B illustrate Y-pullback for a portion of a blind connector half 700 according to an embodiment. For illustrative purposes, the computing tile connectors 210 are not shown in FIG. 18A and 18B. The features of FIGS. 18A and 18B can be applied to any the blind connector half 700 disclosed herein. FIG. 18A illustrates parts of the blind connector half 700 with a Y-adjustment plate 202 in a retracted position. As illustrated in FIG. 18A, adjustment pin 712 is positioned at one end of the Y-pullback cam 1002. FIG. 18B illustrates blind connector half 700 with Y-adjustment plate 202 in a non-retracted position. As illustrated in FIG. 18B, adjustment pin 712 is positioned at an opposite end of the Y-pullback cam 1002 than is illustrated in FIG. 18A.

To transition the Y-adjustment plate 202 from the retracted position of FIG. 18A to the non-retracted position of FIG. 18B, a user may use a tool, such as assembly tool 400, to push the adjustment pin 712 from one end of the Y-pullback cam 1002 to the opposite end of the Y-pullback cam 1002. Similarly, to transition the Y-adjustment plate 202 from the non-retracted position of FIG. 18B to the retracted position of FIG. 18A, a user may use a tool, such as assembly tool 400, to pull the adjustment pin 712 from the opposite end of the Y-pullback cam 1002 back to the one end of the Y-pullback cam 1002.

Unless the context clearly requires otherwise, throughout the description and the claims, the words "comprise," "comprising," "include," "including" and the like are to be construed in an inclusive sense, as opposed to an exclusive or exhaustive sense; that is to say, in the sense of "including, but not limited to." The word "coupled", as generally used herein, refers to two or more elements that may be either directly connected, or connected by way of one or more intermediate elements. Likewise, the word "connected", as generally used herein, refers to two or more elements that may be either directly connected, or connected by way of one or more intermediate elements. Additionally, the words "herein," "above," "below," and words of similar import, when used in this application, shall refer to this application as a whole and not to any particular portions of this application. Where the context permits, words in the above Detailed Description using the singular or plural number may also include the plural or singular number respectively. The word "or" in reference to a list of two or more items, that word covers all of the following interpretations of the word: any of the items in the list, all of the items in the list, and any combination of the items in the list.

Moreover, conditional language used herein, such as, among others, "can," "could," "might," "may," "e.g.," "for example," "such as" and the like, unless specifically stated otherwise, or otherwise understood within the context as used, is generally intended to convey that certain embodiments include, while other embodiments do not include, certain features, elements and/or states. Thus, such conditional language is not generally intended to imply that features, elements and/or states are in any way required for one or more embodiments.

The foregoing description has been described with reference to specific embodiments. However, the illustrative discussions above are not intended to be exhaustive or to limit the inventions to the precise forms described. Many modifications and variations are possible in view of the above teachings. Others skilled in the art are thereby enabled to best utilize the techniques and various embodiments with various modifications as suited to various uses.

Although the disclosure and examples have been described with reference to the accompanying drawings, various changes and modifications will become apparent to those skilled in the art. Such changes and modifications are to be understood as being included within the scope of the disclosure.

What is claimed is:

1. A method comprising:

inserting a system tray into a first computing cabinet with a blind connector half of a blind connector assembly in a first position, wherein:

the system tray comprises a plurality of computing tiles;

the blind connector assembly extends through a first opening in the first computing cabinet and through a second opening in a second computing cabinet adjacent to the first computing cabinet; and the blind connector assembly is configured to connect a first computing tile of the plurality of computing tiles with a second computing tile in the second computing cabinet;

moving the blind connector half in a first dimension from the first position to a second position where the blind connector half is aligned with a tile connection interface of the first computing tile of the plurality of computing tiles in the first dimension; and moving the blind connector half in a second dimension that is orthogonal to the first dimension to connect the blind connector half with the tile connection interface of the first computing tile.

2. The method of claim 1, further comprising:

disconnecting the blind connector half from the tile connection interface;

moving the blind connector half in the first dimension away from the first computing tile; and removing the system tray from the first computing cabinet.

3. The method of claim 2, wherein the blind connector half is connected to the second computing tile located in the second computing cabinet during the removing.

4. The method of claim 1, wherein moving the blind connector half in the first dimension from the first position to the second position comprises using an alignment tool to move a Y-adjustment plate of a connector system along the first dimension, wherein the connector system comprises the blind connector half.

5. The method of claim 1, wherein the first position of the blind connector is out of alignment with the first computing tile and provides clearance for the inserting.

6. The method of claim 1, wherein after the inserting there is no direct access to the blind connector half.

7. The method of claim 1, wherein there is no direct access to the blind connector half during the inserting.

8. The method of claim 1, wherein the blind connector half is connected to the second computing tile located in the second computing cabinet during the moving the blind connector half in the first dimension.

9. The method of claim 1, further comprising:

after the system tray is inserted into the first computing cabinet, inserting an assembly tool into a holder tube of the first computing cabinet; and moving, using the assembly tool, the blind connector half in alignment with the tile connection interface of the first computing tile in a third dimension.

10. A computing system comprising:

a first computing cabinet comprising a first computing tile;

a second computing cabinet adjacent to the first computing cabinet, the second computing cabinet comprising a second computing tile; and a blind connector assembly extending through a first opening in the first computing cabinet and through a second opening in the second computing cabinet, the blind connector assembly being configured to connect the first computing tile with the second computing tile, the blind connector assembly comprising a computing tile connector and an adjustment plate configured to adjust the computing tile connector in a first dimension;

wherein the adjustment plate is configured to move along the first dimension away from the first computing tile.

11. The computing system of claim 10, wherein the adjustment plate includes an adjustment pin movable along a cam.

12. The computing system of claim 11, wherein the first computing cabinet comprises a holder tube configured to provide an adjustment tool with access to the adjustment pin.

13. The computing system of claim 10, wherein the first computing tile is positioned on a system tray, the computing system configured such that there is no direct access to the blind connector assembly when the system tray is positioned in the first computing cabinet.

14. The computing system of claim 10, further comprising a plurality of system trays positioned in the first computing cabinet, each system tray of the plurality of system trays comprising a plurality of computing tiles.

15. The computing system of claim 10, further comprising a plurality of computing tiles in the second computing cabinet, the plurality of computing tiles comprising the second computing tile.

16. The computing system of claim 10, further comprising a holder tube within the first computing cabinet and dimensioned to receive an assembly tool, the holder tube configured to provide the assembly tool with access to the blind connector assembly to connect the blind connector assembly to the first computing tile.

17. The computing system of claim 10, wherein the blind connector assembly further comprises a second adjustment plate configured to adjust the computing tile connector in a second dimension that is orthogonal to the first dimension to connect the blind connector assembly with a tile connection interface of the first computing tile.

18. A method comprising:

disconnecting a blind connector assembly from a first computing tile on a system tray while the system tray is positioned in a first computing cabinet, wherein:

the blind connector assembly extends through a first opening in the first computing cabinet and through a second opening in a second computing cabinet adjacent to the first computing cabinet; and the blind connector assembly connects the first computing tile with a second computing tile in the second computing cabinet prior to the disconnecting;

after the disconnecting, moving the blind connector assembly in a first dimension away from the first computing tile to a pullback position; and removing the system tray from the first computing cabinet while the blind connector assembly is in the pullback position.

19. The method of claim 18, wherein the moving the blind connector assembly in the first dimension away from the first computing tile to the pullback position comprises using an alignment tool to move an adjustment plate of the blind connector assembly along the first dimension.

20. The method of claim 18, wherein the blind connector assembly is connected to the second computing tile located in the second computing cabinet during the removing.

* * * * *